US012681103B2

(12) United States Patent
Harrington et al.

(10) Patent No.: US 12,681,103 B2
(45) Date of Patent: Jul. 14, 2026

(54) ELECTROCHEMICAL IMPEDANCE SPECTROSCOPY CURRENT MEASUREMENT SYSTEM GAIN CONTROL

(71) Applicant: Analog Devices, Inc., Wilmington, MA (US)

(72) Inventors: Brian Harrington, Upton, MA (US); Sheila Patricia Seidel, Jamaica Plain, MA (US); Leah Alexis Garber, Carlisle, MA (US); Sue Zheng, Melrose, MA (US); Kate Danielle Fischl, Jamaica Plain, MA (US); Atulya Yellepeddi, Medford, MA (US)

(73) Assignee: Analog Devices, Inc., Wilmington, MA (US)

( * ) Notice: Subject to any disclaimer, the term of this patent is extended or adjusted under 35 U.S.C. 154(b) by 157 days.

(21) Appl. No.: 18/595,294

(22) Filed: Mar. 4, 2024

(65) Prior Publication Data

US 2024/0302445 A1      Sep. 12, 2024

Related U.S. Application Data

(60) Provisional application No. 63/488,598, filed on Mar. 6, 2023, provisional application No. 63/488,619, filed on Mar. 6, 2023.

(51) Int. Cl.
    *G01R 31/389*          (2019.01)
    *G01R 31/367*          (2019.01)
    (Continued)

(52) U.S. Cl.
    CPC ......... *G01R 31/389* (2019.01); *G01R 31/367* (2019.01); *G01R 31/3842* (2019.01); *G01R 31/396* (2019.01)

(58) Field of Classification Search
    None
    See application file for complete search history.

(56) References Cited

U.S. PATENT DOCUMENTS

| | | | |
|---|---|---|---|
| 6,160,382 A | 12/2000 | Yoon et al. | |
| 6,208,147 B1 | 3/2001 | Yoon et al. | |

(Continued)

FOREIGN PATENT DOCUMENTS

| | | |
|---|---|---|
| CN | 110058159 A | 7/2019 |
| DE | 10220172.2 B4 | 1/2006 |

(Continued)

OTHER PUBLICATIONS

"European Application Serial No. 24161694.5, Extended European Search Report mailed Jul. 30, 2024", 10 pgs.

(Continued)

*Primary Examiner* — Jas A Sanghera
(74) *Attorney, Agent, or Firm* — Schwegman Lundberg & Woessner, P.A.

(57)          ABSTRACT

A method for selecting one or more gain values in an electrochemical impedance spectroscopy (EIS) current measurement system to provide an improved signal-to-noise characteristic can include selecting a larger one of an electrochemical cell arrangement impedance indication value and a sense resistor arrangement impedance indication value and using the selected impedance indication value as a determined impedance indication value. The method can also include determining, for a plurality of gain setting combinations, an EIS excitation current value at which current measurement circuitry of the current measurement system will reach a specified amount of a non-saturation range of the current measurement system when measuring the determined impedance indication value. The method can also include determining, for the plurality of gain setting combinations, a signal-to-noise characteristic at the deter- (Continued)

mined EIS excitation current based upon a determined noise level in at least one part of the EIS current measurement system.

20 Claims, 13 Drawing Sheets

(51) Int. Cl.
　　 G01R 31/3842 　　 (2019.01)
　　 G01R 31/396 　　 (2019.01)

(56) References Cited

U.S. PATENT DOCUMENTS

| | | | | |
|---|---|---|---|---|
| 8,332,342 | B1 | 12/2012 | Saha et al. | |
| 8,508,232 | B2 | 8/2013 | Yugou et al. | |
| 8,779,777 | B2 | 7/2014 | Irmer et al. | |
| 8,907,675 | B2 | 12/2014 | Phlippoteau et al. | |
| 9,056,556 | B1 | 6/2015 | Hyde et al. | |
| 9,164,150 | B2 | 10/2015 | Okada | |
| 9,465,078 | B2 | 10/2016 | Betzner | |
| 9,496,861 | B2 | 11/2016 | Shimomura et al. | |
| 9,791,519 | B2 | 10/2017 | Kelly | |
| 10,209,314 | B2 | 2/2019 | Garcia et al. | |
| 10,379,168 | B2 | 8/2019 | Christophersen et al. | |
| 10,408,880 | B2 | 9/2019 | Lin et al. | |
| 2006/0152224 | A1* | 7/2006 | Kim | G01R 31/392 |
| | | | | 324/430 |
| 2012/0086430 | A1 | 4/2012 | Marten | |
| 2014/0358462 | A1 | 12/2014 | Christophersen et al. | |
| 2015/0021193 | A1 | 1/2015 | Verfuss et al. | |
| 2016/0336623 | A1 | 11/2016 | Nayar et al. | |
| 2018/0095141 | A1 | 4/2018 | Wild et al. | |
| 2019/0146050 | A1 | 5/2019 | Regier et al. | |
| 2020/0116764 | A1 | 4/2020 | Schramme et al. | |
| 2020/0280108 | A1 | 9/2020 | Tomar et al. | |
| 2020/0333376 | A1 | 10/2020 | Graf et al. | |
| 2021/0033690 | A1 | 2/2021 | Kasper | |
| 2021/0109162 | A1 | 4/2021 | Matsukawa et al. | |
| 2021/0333328 | A1 | 10/2021 | Chung et al. | |
| 2022/0209307 | A1 | 6/2022 | Mcbride et al. | |
| 2024/0302443 | A1 | 9/2024 | Yellepeddi et al. | |
| 2024/0302444 | A1 | 9/2024 | Harrington et al. | |
| 2024/0302472 | A1 | 9/2024 | Harrington et al. | |

FOREIGN PATENT DOCUMENTS

| | | | |
|---|---|---|---|
| KR | 20110027037 A | 3/2011 | |
| KR | 20200023672 A | 3/2020 | |
| KR | 102106775 B1 | 5/2020 | |
| WO | 0140810 | 6/2001 | |
| WO | WO-2016071801 A1 | 5/2016 | |
| WO | 2017140874 | 8/2017 | |
| WO | WO-2018156480 A1 | 8/2018 | |
| WO | WO-2022177764 A1 | 8/2022 | |

OTHER PUBLICATIONS

"Electrochemical Impedance Spectroscopy (EIS) for Batteries", Anonymous, [Online]. Retrieved from the Internet: <https://www.analog.com/media/en/reference-designdocumentation/reference-designs/CN0510.pdf>, (Apr. 1, 2020), 1-6.

"European Application Serial No. 24161693.7, Extended European Search Report mailed Jul. 30, 2024", 9 pgs.

"European Application Serial No. 24161691.1, Extended European Search Report mailed Jul. 30, 2024", 8 pgs.

"European Application Serial No. 24161692.9, Extended European Search Report mailed Jul. 30, 2024", 9 pgs.

"European Application Serial No. 24161693.7, Response filed Oct. 3, 2024 Extended European Search Report mailed Jul. 30, 2024", 17 pgs.

"European Application Serial No. 24161691.1, Response filed Oct. 3, 2024 to Extended European Search Report mailed Jul. 30, 2024", 22 pgs.

"European Application Serial No. 24161692.9, Response filed Oct. 3, 2024 to Extended European Search Report mailed Jul. 30, 2024", 17 pgs.

"European Application Serial No. 24161694.5, Response filed Oct. 3, 2024 to Extended European Search Report mailed Jul. 30, 2024", 17 pgs.

Rusanto, Benyamin H, "Primary measurement method for the characterisation of impedance standard in the m [Omega] range", Measurement Science and Technology, IOP, Bristol, GB, vol. 33, No. 8, (May 18, 2022), 11 pgs.

"International Application Serial No. PCT/US2022/015338, International Preliminary Report on Patentability mailed Aug. 31, 2023", 7 pgs.

"International Application Serial No. PCT/US2022/015338, International Search Report mailed May 25, 2022", 4 pgs.

"International Application Serial No. PCT/US2022/015338, Written Opinion mailed May 25, 2022", 5 pgs.

Attanayaka, A.M.S.M.H.S, et al., "Estimation of state of charge for lithium-ion batteries—A Review", AIMS Energy, 7(2), (Apr. 17, 2019), 186-210.

Barai, Anup, et al., "A comparison of methodologies for the non-invasive characterisation of commercial Li-ion cells", Progress in Energy and Combustion Science 72, (2019), 31 pgs.

Chang, Wen-Yeau, "The State of Charge Estimating Methods for Battery: A Review", ISRN Applied Mathematics, vol. 2013, Art. 953792, (2013), 8 pgs.

Eddahech, Akram, et al., "Behavior and state-of-health monitoring of Li-ion batteries using impedance spectroscopy and recurrent neural networks", International Journal of Electrical Power & Energy Systems, 42(1), (Nov. 2012), 487-494.

Fleischer, Christian, et al., "On-line adaptive battery impedance parameter and state estimation considering physical principles in reduced order equivalent circuit battery models—Part 1. Requirements, critical review of methods and modeling", Journal of Power Sources 260, (2014), 276-291.

Fouquet, N, et al., "Model based PEM fuel cell state-of-health monitoring via ac impedance measurements", preprint, Journal of Power Sources, (2005), 10 pgs.

Kim, Taesic, "Model-Based Condition Monitoring and Power Management for Rechargeable Electrochemical Batteries", Doctorate Dissertation, University of Nebraska—Lincoln, (May 2015), 214 pgs.

Li, Y, et al., "Data-driven health estimation and lifetime prediction of lithium-ion batteries: A review", Renewable and Sustainable Energy Reviews, 113, [109254], (2019), 61 pgs.

Sarmah, Sudipta Bijoy, et al., "A Review of State of Health Estimation of Energy Storage Systems: Challenges and Possible Solutions for Futuristic Applications of Li-Ion Battery Packs in Electric Vehicles", Journal of Electrochemical Energy Conversion and Storage, vol. 16, ASME, (Nov. 2019), 040801-12.

Xiong, Rui, et al., "A systematic model-based degradation behavior recognition and health monitoring method for lithium-ion batteries", Applied Energy 207, (2017), 372-383.

Zhang, Yunwei, et al., "Identifying degradation patterns of lithium ion batteries from impedance spectroscopy using machine learning", Nature Communications, 11(1), (2020), 6 pgs.

"U.S. Appl. No. 18/595,248, Non Final Office Action mailed Oct. 2, 2025", 12 pgs.

"U.S. Appl. No. 18/595,248, Response filed Dec. 30, 2025 to Non Final Office Action mailed Oct. 2, 2025", 8 pgs.

"U.S. Appl. No. 18/595,283, Notice of Allowance mailed Oct. 21, 2025", 9 pgs.

* cited by examiner

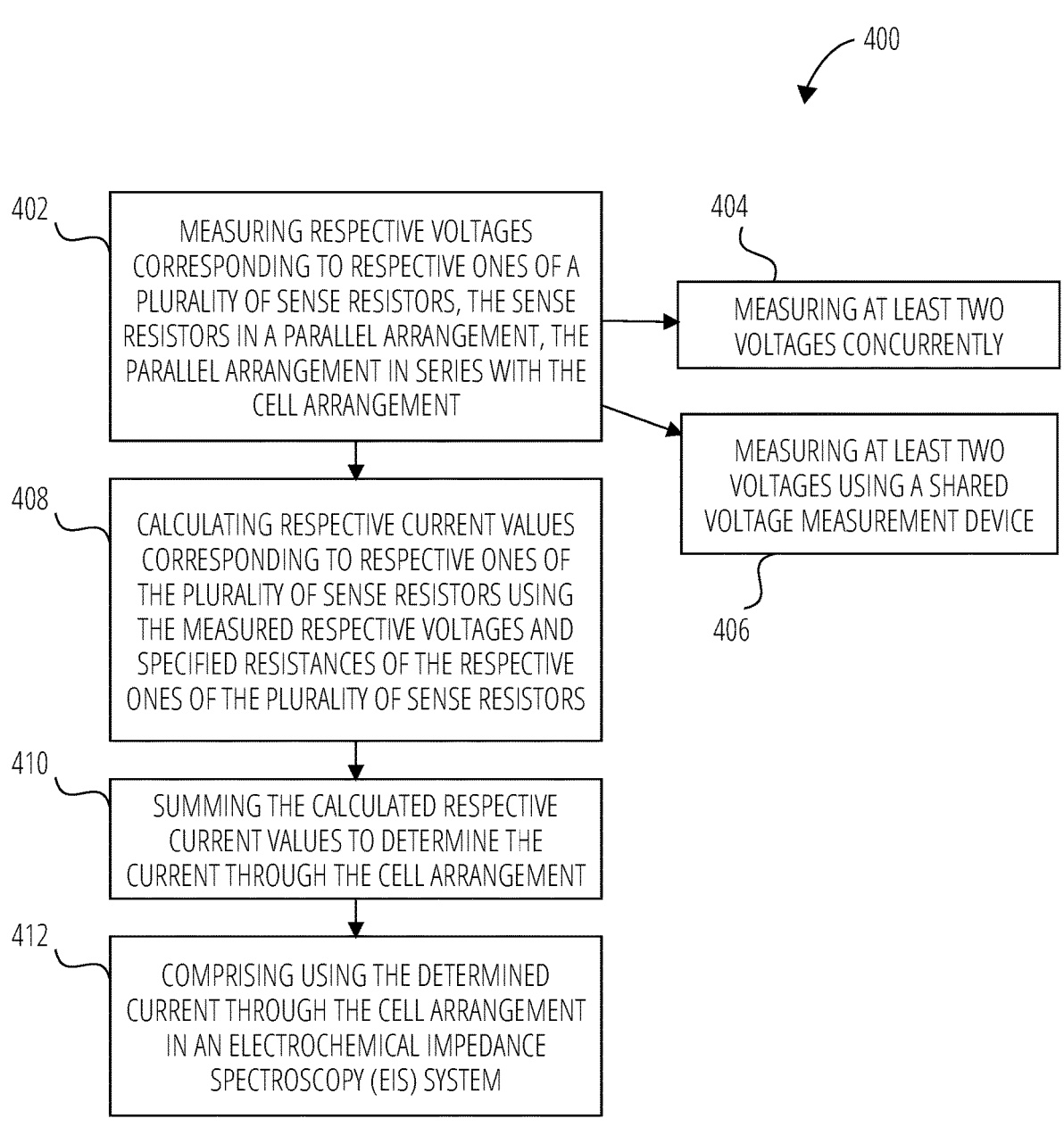

400

402 — MEASURING RESPECTIVE VOLTAGES CORRESPONDING TO RESPECTIVE ONES OF A PLURALITY OF SENSE RESISTORS, THE SENSE RESISTORS IN A PARALLEL ARRANGEMENT, THE PARALLEL ARRANGEMENT IN SERIES WITH THE CELL ARRANGEMENT

404 — MEASURING AT LEAST TWO VOLTAGES CONCURRENTLY

406 — MEASURING AT LEAST TWO VOLTAGES USING A SHARED VOLTAGE MEASUREMENT DEVICE

408 — CALCULATING RESPECTIVE CURRENT VALUES CORRESPONDING TO RESPECTIVE ONES OF THE PLURALITY OF SENSE RESISTORS USING THE MEASURED RESPECTIVE VOLTAGES AND SPECIFIED RESISTANCES OF THE RESPECTIVE ONES OF THE PLURALITY OF SENSE RESISTORS

410 — SUMMING THE CALCULATED RESPECTIVE CURRENT VALUES TO DETERMINE THE CURRENT THROUGH THE CELL ARRANGEMENT

412 — COMPRISING USING THE DETERMINED CURRENT THROUGH THE CELL ARRANGEMENT IN AN ELECTROCHEMICAL IMPEDANCE SPECTROSCOPY (EIS) SYSTEM

FIG. 4

502 MEASURE THE VOLTAGE ACROSS THE FIRST SENSE RESISTOR 106 AT A SPECIFIED EIS FREQUENCY

504 MEASURE THE VOLTAGE ACROSS THE FIRST SENSE RESISTOR 106 AT ZERO FREQUENCY

506 MEASURE THE VOLTAGE ACROSS THE SECOND SENSE RESISTOR 108 AT THE SPECIFIED EIS FREQUENCY

508 MEASURE THE VOLTAGE ACROSS THE SECOND SENSE RESISTOR 108 AT ZERO FREQUENCY

900

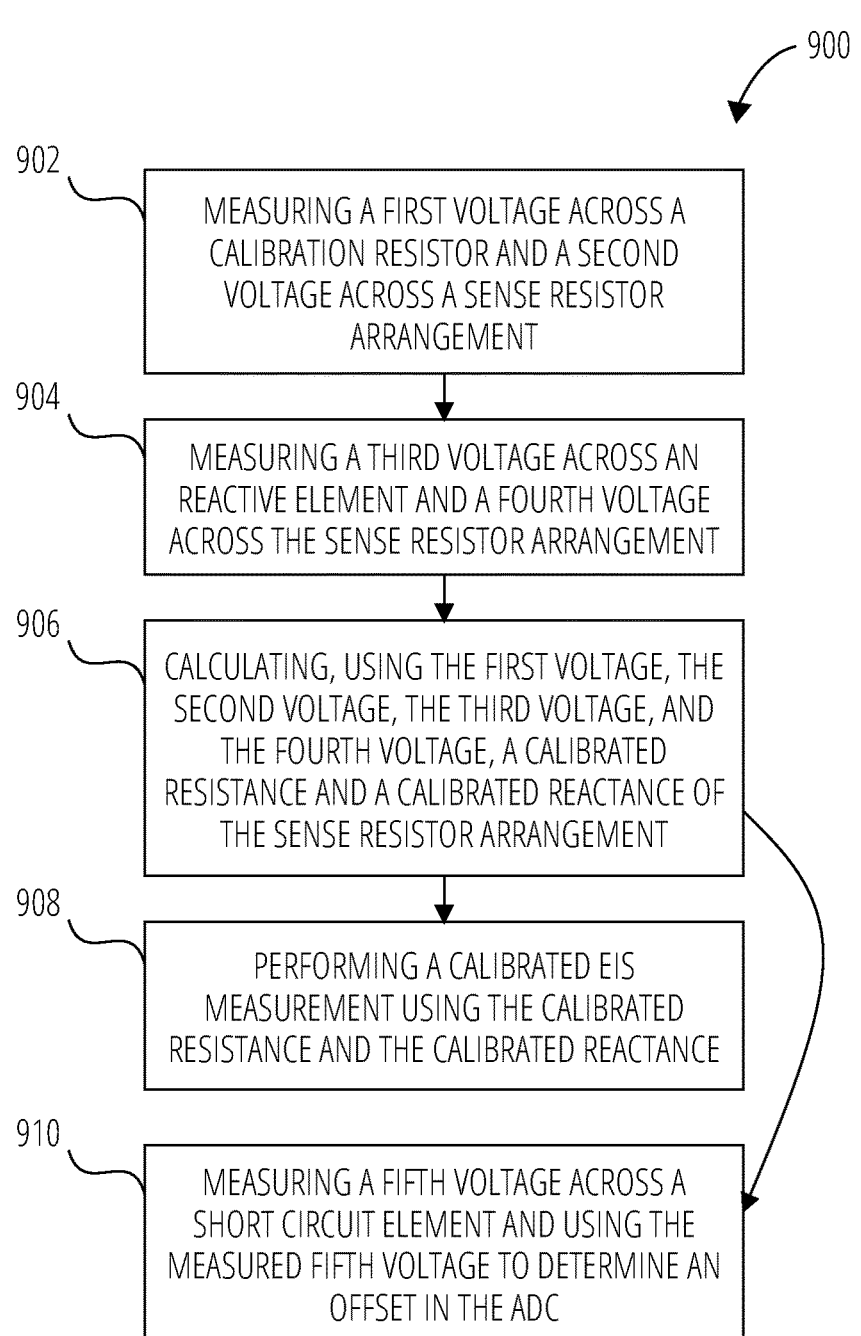

902

MEASURING A FIRST VOLTAGE ACROSS A CALIBRATION RESISTOR AND A SECOND VOLTAGE ACROSS A SENSE RESISTOR ARRANGEMENT

904

MEASURING A THIRD VOLTAGE ACROSS AN REACTIVE ELEMENT AND A FOURTH VOLTAGE ACROSS THE SENSE RESISTOR ARRANGEMENT

906

CALCULATING, USING THE FIRST VOLTAGE, THE SECOND VOLTAGE, THE THIRD VOLTAGE, AND THE FOURTH VOLTAGE, A CALIBRATED RESISTANCE AND A CALIBRATED REACTANCE OF THE SENSE RESISTOR ARRANGEMENT

908

PERFORMING A CALIBRATED EIS MEASUREMENT USING THE CALIBRATED RESISTANCE AND THE CALIBRATED REACTANCE

910

MEASURING A FIFTH VOLTAGE ACROSS A SHORT CIRCUIT ELEMENT AND USING THE MEASURED FIFTH VOLTAGE TO DETERMINE AN OFFSET IN THE ADC

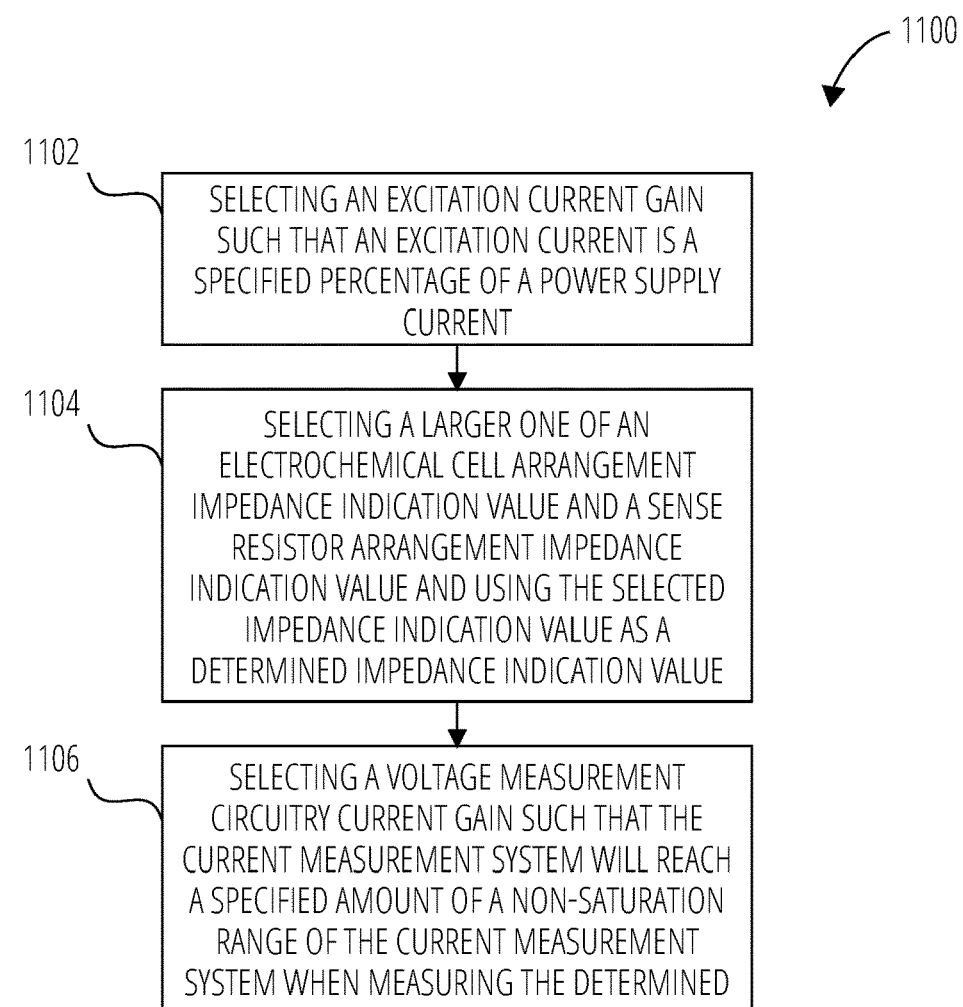

1102

SELECTING AN EXCITATION CURRENT GAIN SUCH THAT AN EXCITATION CURRENT IS A SPECIFIED PERCENTAGE OF A POWER SUPPLY CURRENT

1104

SELECTING A LARGER ONE OF AN ELECTROCHEMICAL CELL ARRANGEMENT IMPEDANCE INDICATION VALUE AND A SENSE RESISTOR ARRANGEMENT IMPEDANCE INDICATION VALUE AND USING THE SELECTED IMPEDANCE INDICATION VALUE AS A DETERMINED IMPEDANCE INDICATION VALUE

1106

SELECTING A VOLTAGE MEASUREMENT CIRCUITRY CURRENT GAIN SUCH THAT THE CURRENT MEASUREMENT SYSTEM WILL REACH A SPECIFIED AMOUNT OF A NON-SATURATION RANGE OF THE CURRENT MEASUREMENT SYSTEM WHEN MEASURING THE DETERMINED IMPEDANCE INDICATION VALUE.

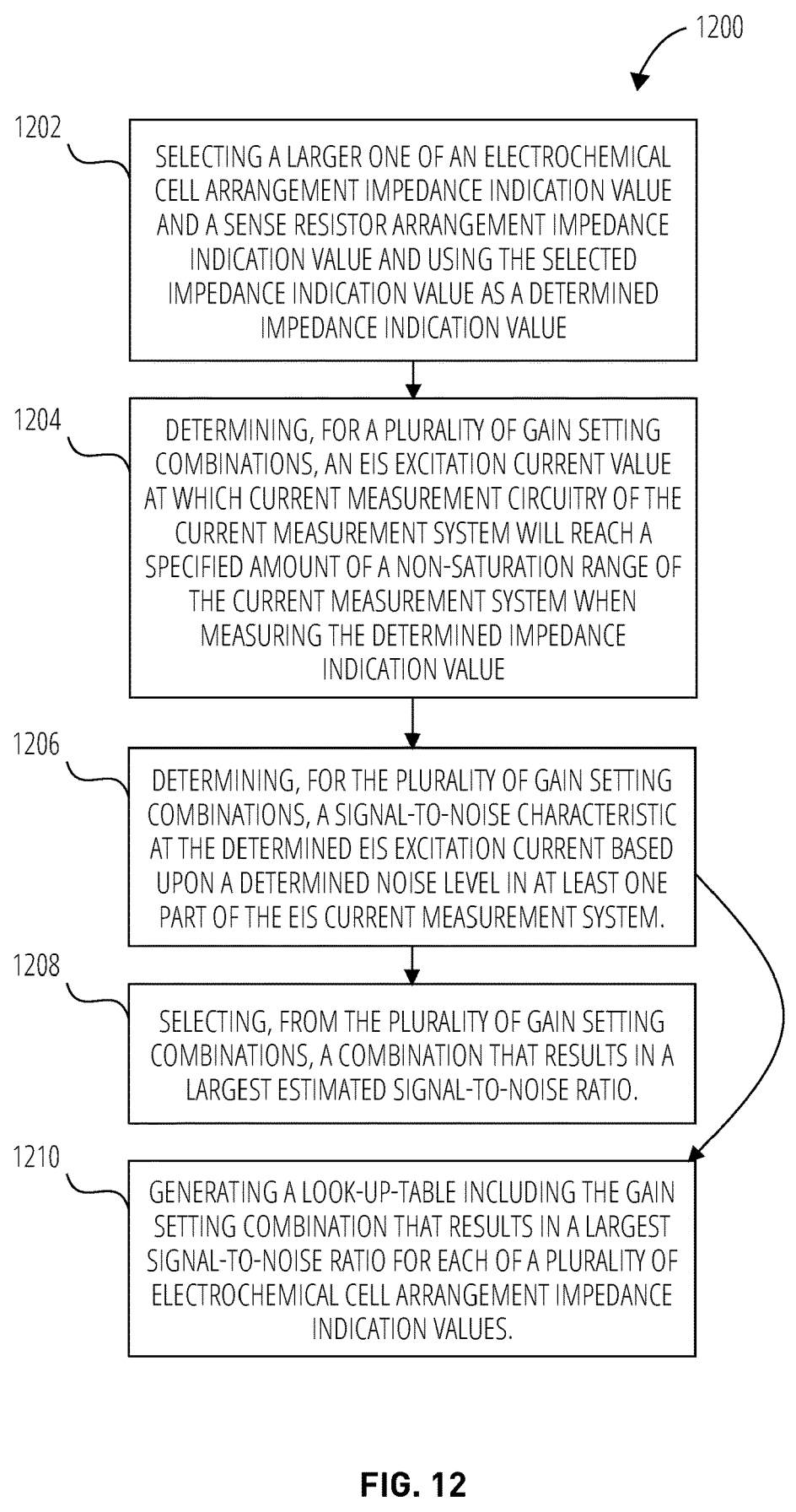

1202 — SELECTING A LARGER ONE OF AN ELECTROCHEMICAL CELL ARRANGEMENT IMPEDANCE INDICATION VALUE AND A SENSE RESISTOR ARRANGEMENT IMPEDANCE INDICATION VALUE AND USING THE SELECTED IMPEDANCE INDICATION VALUE AS A DETERMINED IMPEDANCE INDICATION VALUE

1204 — DETERMINING, FOR A PLURALITY OF GAIN SETTING COMBINATIONS, AN EIS EXCITATION CURRENT VALUE AT WHICH CURRENT MEASUREMENT CIRCUITRY OF THE CURRENT MEASUREMENT SYSTEM WILL REACH A SPECIFIED AMOUNT OF A NON-SATURATION RANGE OF THE CURRENT MEASUREMENT SYSTEM WHEN MEASURING THE DETERMINED IMPEDANCE INDICATION VALUE

1206 — DETERMINING, FOR THE PLURALITY OF GAIN SETTING COMBINATIONS, A SIGNAL-TO-NOISE CHARACTERISTIC AT THE DETERMINED EIS EXCITATION CURRENT BASED UPON A DETERMINED NOISE LEVEL IN AT LEAST ONE PART OF THE EIS CURRENT MEASUREMENT SYSTEM.

1208 — SELECTING, FROM THE PLURALITY OF GAIN SETTING COMBINATIONS, A COMBINATION THAT RESULTS IN A LARGEST ESTIMATED SIGNAL-TO-NOISE RATIO.

1210 — GENERATING A LOOK-UP-TABLE INCLUDING THE GAIN SETTING COMBINATION THAT RESULTS IN A LARGEST SIGNAL-TO-NOISE RATIO FOR EACH OF A PLURALITY OF ELECTROCHEMICAL CELL ARRANGEMENT IMPEDANCE INDICATION VALUES.

FIG. 12

ELECTROCHEMICAL IMPEDANCE SPECTROSCOPY CURRENT MEASUREMENT SYSTEM GAIN CONTROL

CLAIM OF PRIORITY

This patent application claims the benefit of priority of Yellepeddi et al., U.S. Provisional Patent Application Ser. No. 63/488,619, entitled "ELECTROCHEMICAL IMPEDANCE MONITOR USING MULTIPLE SENSE RESISTORS," filed on Mar. 6, 2023 and Harrington et al., U.S. Provisional Patent Application Ser. No. 63/488,598, entitled "ACCURATELY MEASURING HIGH-CURRENT ELECTROCHEMICAL IMPEDANCE SPECTRA FOR ELECTROLYZERS," filed on Mar. 6, 2023, which are hereby incorporated by reference herein in their entirety.

TECHNICAL FIELD

The present disclosure relates to electronics, and more particularly, but not by way of limitation, to a current measurement system that can measure a current through electrochemical cells in a cell arrangement.

BACKGROUND

Modern systems can use electrochemical cells, such as energy storage systems and electrolysis systems. Energy storage systems can include batteries or fuel cells, and can be a main power source or an auxiliary power source. Electrolysis systems can include electrolysis cells, such as for driving a chemical reaction using electrical energy. Examples of such modern systems can include consumer electronics, industrial electronics, passenger cars, industrial trucks, and industrial processing plants. Monitoring a parameter of a cell, such as the state of charge (SoC) or the state of health (SoH), can help ensure reliable operation of the system and avoid unnecessary damage to the cell, such as due to overheating.

SUMMARY

In an example, a method for selecting one or more gain values in an electrochemical impedance spectroscopy (EIS) current measurement system to provide an improved signal-to-noise characteristic can include selecting a larger one of an electrochemical cell arrangement impedance indication value and a sense resistor arrangement impedance indication value and using the selected impedance indication value as a determined impedance indication value. The method can also include determining, for a plurality of gain setting combinations, an EIS excitation current value at which current measurement circuitry of the current measurement system will reach a specified amount of a non-saturation range of the current measurement system when measuring the determined impedance indication value. The method can also include determining, for the plurality of gain setting combinations, a signal-to-noise characteristic at the determined EIS excitation current based upon a determined noise level in at least one part of the EIS current measurement system.

In an example, a method for selecting one or more gain values in an electrochemical impedance spectroscopy (EIS) current measurement system to provide an improved signal-to-noise characteristic can include selecting an excitation current gain such that an excitation current is a specified percentage of a power supply current. The method can also include selecting a larger one of an electrochemical cell arrangement impedance indication value and a sense resistor arrangement impedance indication value and using the selected impedance indication value as a determined impedance indication value. The method can also include selecting a voltage measurement circuitry current gain such that the current measurement system can reach a specified amount of a non-saturation range of the current measurement system when measuring the determined impedance indication value.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

FIG. 4 shows an example of portions of a method for operating a current measurement system.

FIG. 9 shows an example of portions of a method for operating a calibration system.

FIG. 11 shows an example of portions of a method for selecting one or more gain settings in a current measurement system.

FIG. 12 shows an example of portions of a method for selecting one or more gain settings in a current measurement system.

DETAILED DESCRIPTION

Figure 1:
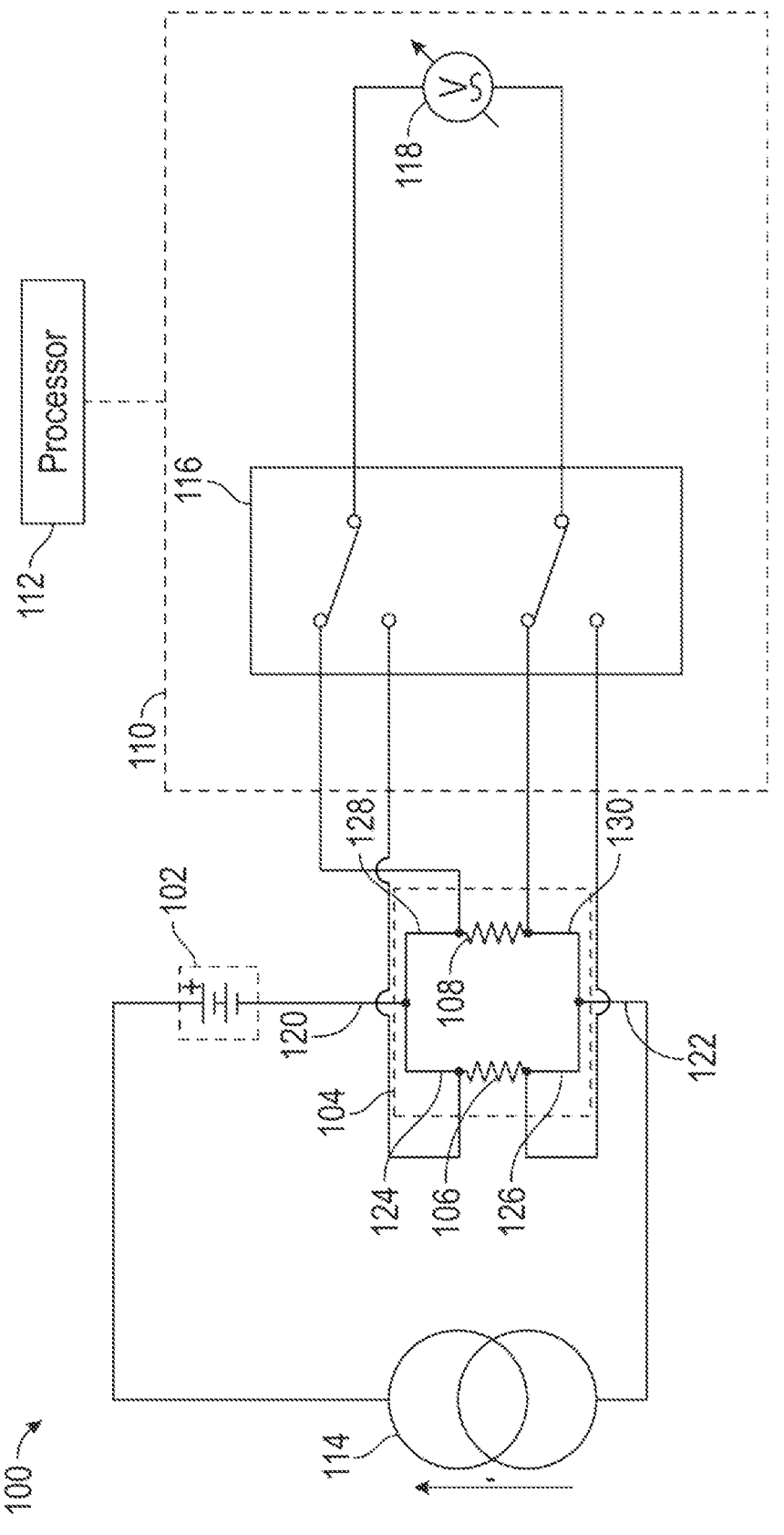
FIG. 1 is a schematic drawing of an example of portions of a current measurement system.

One approach to estimate or measure a parameter of an electrochemical cell, such as the SoC or SoH, is electrochemical impedance spectroscopy (EIS). EIS can include measuring the impedance (e.g., DC resistance, AC impedance, complex impedance (e.g., the AC impedance including a real and imaginary component based upon the phase relationship of voltage and current)) of a cell arrangement of electrochemical cells at one or more frequencies. The determined complex impedance of a portion of (e.g., half of, all of) the cell arrangement can be used to obtain information about the SoC and SoH of a portion of the cell arrangement. The cell arrangement can include one or more electrochemical cells. An electrochemical cell can include a galvanic cell (e.g., voltaic cell), which can convert chemical energy to electrical energy, or an electrolytic cell (e.g., electrolysis cell), which can use electrical energy to drive a chemical reaction. Examples of galvanic cells can include batteries and or fuel cells. Examples of electrolytic cells can include a water electrolysis cell, which can produce hydrogen using electrical power.

Making an EIS measurement can include measuring a current through the cell arrangement, a voltage across the cell arrangement, or both. A measured current and voltage can be used to determine the complex impedance of the cell arrangement. Measuring a current can include measuring a voltage across a resistance (e.g., a shunt resistance), such as can be in series with the cell arrangement. The complex impedance of the cell arrangement at a specified EIS frequency can be used to determine or infer one or more EIS parameters (e.g., EIS properties).

The present inventors have recognized, among other things, that a current through an electrochemical cell can be large (e.g., 50 amperes to 4000 amperes). The energy dissipated in the shunt resistance can be correlated (e.g., quadratically, exponentially) to the current through the electrochemical cell. Therefore, a higher power rating sense resistance can be desired in a system with a larger current. A cost of a resistance element can scale non-linearly (e.g., exponentially) with the power dissipation rating. While cost may not scale linearly, increasing the number of sense resistors in a parallel arrangement (e.g., adding one or more additional sense resistors) may scale linearly in cost (e.g., doubling the number of resistors in a parallel arrangement can double the power dissipation rating while doubling the cost).

A resistance value of the shunt resistance can be inversely correlated to the current through the shunt resistor to achieve the same voltage across the shunt resistor, such as for input to a voltage measurement device. Therefore, shunt resistance can be decreased as current increases. An inductance of a resistance element can scale non-linearly (e.g., exponentially) with the inverse of the resistance value (e.g., decreasing resistance can exponentially increase inductance). Inductance in the sense resistance can affect the accuracy of EIS measurements. While inductance may not scale linearly with the inverse of resistance, increasing the number of sense resistors in a parallel arrangement (e.g., cutting the sense resistance in half by adding a matching sense resistor) may scale linearly with respect to inductance added.

The present inventors have recognized, among other things, a benefit of a current measurement system that can include two or more sense resistors (e.g., shunt resistors) in a parallel arrangement. This system can have similar properties to a system with a single shunt resistor of a smaller resistance value than the two or more sense resistors individually and a greater power dissipation than the two or more sense resistors individually. A current through each of the two or more sense resistors can be computed individually and summed, which can determine a total current through the parallel arrangement.

FIG. 1 is a schematic drawing of an example of portions of a current measurement system 100. The current measurement system 100 can be an EIS current measurement system, such as for measuring a current through a cell arrangement 102 including one or more electrochemical cells. FIG. 1 shows that the current measurement system 100 can include a cell arrangement 102, a parallel arrangement of a plurality of sense resistors 104, voltage measurement circuitry 110, processor circuitry 112, and a test current source or sink 114.

The cell arrangement can include at least one of a battery cell (e.g., a lead acid battery cell, a lithium ion battery cell), a fuel cell (e.g., a hydrogen fuel cell), an electrolysis cell (e.g., a water electrolysis cell, such as a proton exchange membrane (PEM) electrolysis cell or solid oxide electrolysis cell, a chloralkali electrolysis cell, a molten salt electrolysis cell), or other electrochemical cell. The cell arrangement can include one or more electrochemical cells, such as can include one electrochemical cell, two electrochemical cells, three electrochemical cells, four or more electrochemical cells, 10 or more electrochemical cells, or 100 or more electrochemical cells. All of the electrochemical cells can be of the same type, or one or more of the cells can be of a different type than one or more of the other cells. The one or more cells can include a series arrangement of electrochemical cells, a parallel arrangement of electrochemical cells, or both. The cell arrangement is discussed in more detail with respect to FIG. 3 below.

FIG. 1 shows that the parallel arrangement of a plurality of sense resistors 104 can include a first sense resistor 106 and a second sense resistor 108. The parallel arrangement of a plurality of sense resistors 104 can be placed in series with the cell arrangement 102, which can result in a current through the parallel arrangement of a plurality of sense resistors 104 matching a current through the cell arrangement 102. The first sense resistor 106 can be arranged (e.g., wired, connected, configured) in parallel with the second sense resistor 108. The parallel arrangement of a plurality of sense resistors 104 can include a first node 120 and a second node 122. The first sense resistor 106 can include a first terminal 124 and a second terminal 126. The second sense resistor 108 can include a first terminal 128 and a second terminal 130. The first terminal 124 and the first terminal 128 can be coupled to the first node 120, and the second terminal 126 and the second terminal 130 can be coupled to the second node 122. The first sense resistor 106 and the second sense resistor 108 can share the current through the parallel arrangement of a plurality of sense resistors 104 (e.g., a portion (e.g., half, one-third, all) of the current through the parallel arrangement of a plurality of sense resistors 104 can pass through the first sense resistor 106, and the remaining current through the parallel arrangement of a plurality of sense resistors 104 can pass through the second sense resistor 108). Summing the current through the first sense resistor 106 with the current through the second sense resistor 108 can determine the current through the parallel arrangement of a plurality of sense resistors 104.

Figure 2:
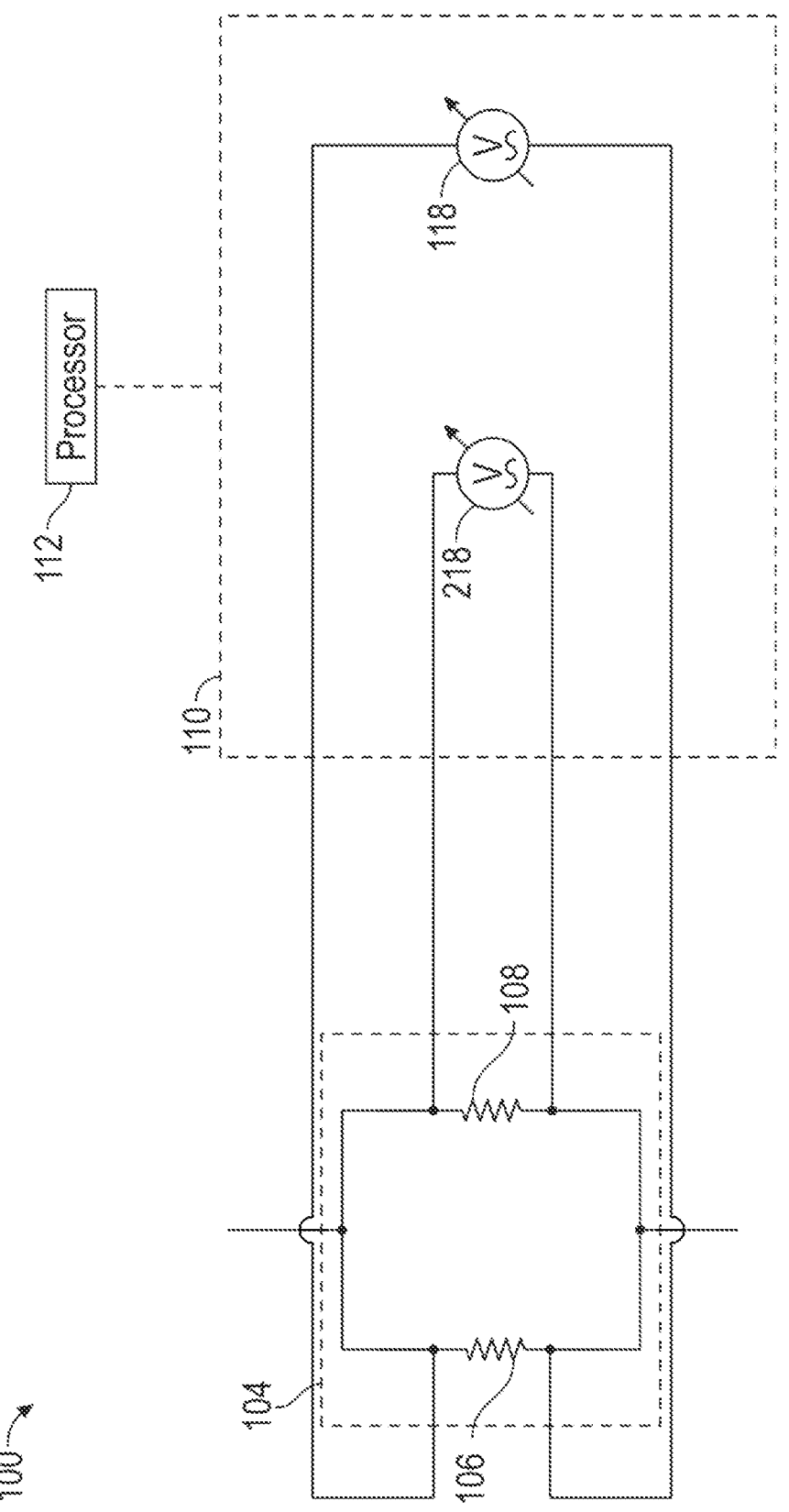
FIG. 2 is a schematic drawing of an example of portions of a current measurement system.

The parallel arrangement of a plurality of sense resistors 104 can include two or more sense resistors, such as can include two sense resistors (e.g., as shown in FIG. 2), three sense resistors, four sense resistors, or five or more sense resistors. The sense resistors can be arranged in any configuration. In an example, all of the sense resistors can be in a parallel arrangement. In an example, two or more of the resistors can be arranged in series (e.g., a series arrangement of two sense resistors in parallel with one or more other sense resistors and/or series arrangements of sense resistors). In an example, the combined parallel resistance value (e.g., the effective resistance value) of the parallel arrangement of a plurality of sense resistors 104 can be configured to be approximately equal to a resistance of the cell arrangement 102, such as a resistance of the cell arrangement 102 at a specific frequency or frequency range (e.g., 0 hertz, 4,000-5000 hertz). This can help to minimize a signal-to-noise ratio in an EIS system, such as the current measurement system 100, such as by approximately matching a voltage across the cell arrangement 102 to a voltage across the parallel arrangement of a plurality of sense resistors 104.

The first sense resistor 106 and the second sense resistor 108 can have any resistance value. The sense resistors (e.g., the first sense resistor 106 and the second sense resistor 108) can be configured to match (e.g., similar resistance, similar power rating), or can differ in one or more ways. In an example where the first sense resistor 106 matches the second sense resistor 108, the current through the parallel arrangement of a plurality of sense resistors 104 can be shared substantially equally between the first sense resistor 106 and the second sense resistor 108. In an example where the first sense resistor 106 has a greater resistance than the second sense resistor 108, a greater portion of the current through the parallel arrangement of a plurality of sense resistors 104 can pass through the second sense resistor 108 than the first sense resistor 106.

In an example, the parallel arrangement of a plurality of sense resistors 104 is configured to be capable of handling one or more of a current that exceeds 300 amperes, a current that exceeds 1000 amperes, or a current that exceeds 3000 amperes. In an example, the parallel arrangement of a plurality of sense resistors 104 (e.g., the plurality of sense resistors in combination) are configured to be capable of dissipating one or more of over 100 watts of power, over 200 watts of power, or over 300 watts of power. For example, each of the first sense resistor 106 and the second sense resistor 108 can be configured to dissipate 50 watts, and together in the parallel arrangement of a plurality of sense resistors 104, can be configured to dissipate 100 watts.

One or more of the sense resistors can be a four-wire resistor. For example, the first terminal 124 can have two leads, and the second terminal 126 can have two leads. One of the leads at each terminal can be used for current conduction (e.g., a conduction lead, in series with the cell arrangement 102) and one of the leads at each terminal can be used for voltage measurement (e.g., a measurement lead, connected to the voltage measurement circuitry 110). A four-wire resistor can remove, reduce, or otherwise tailor the effect of a resistor lead (e.g., a conductor, such as a metallic conductor, coupled to a resistive material, such as a carbon material or a copper material), on a voltage measurement, such as by reducing a current through the measurement lead to a high input impedance voltage measurement circuit. In an example, the leads can be one or more of noisier or more inductive than the resistive material, such as can make it desirable to remove or reduce an effect of the leads.

The voltage measurement circuitry 110 can be configured to measure respective voltages across corresponding ones of the sense resistors (e.g., determine a voltage across one or more of the sense resistors, such as each of the sense resistors). The voltage measurement circuitry 110 can include a multiplexer 116 and a voltage measurement device 118. The multiplexer 116 can be coupled to respective individual ones of the sense resistors (e.g., the first sense resistor 106 and the second sense resistor 108, as shown in FIG. 1). The multiplexer 116 can be configured to couple a selected individual one of the sense resistors to the voltage measurement device 118. The multiplexer 116 can be coupled to the measurement leads of one or more of the sense resistors, and can be configured to connect a specified individual one of the sense resistors to the voltage measurement device 118. In an example, the voltage measurement circuitry 110 can be configured to measure a voltage across one or more cells in the cell arrangement 102, such as can include a voltage across the cell arrangement 102.

The voltage measurement device 118 can be any circuit capable of measuring a voltage (e.g., producing a signal indicative of a voltage), such as a voltmeter. The voltage measurement device 118 can be configured to measure a direct current (DC) voltage, an alternating current (AC) voltage, or both. The voltage measurement device 118 can be configured to measure an AC voltage across a range of frequencies, such as can match or at least partially overlap with a range of frequencies used for EIS measurements.

The processor circuitry 112 can be coupled to the voltage measurement circuitry. The processor circuitry 112 can be configured to calculate at least one of an AC or DC current through the cell arrangement. The processor circuitry 112 can be coupled to the voltage measurement circuitry 110, such as can include being coupled to one or more of the multiplexer 116 or the voltage measurement device 118. For example, the processor circuitry 112 can be configured to control the multiplexer 116 to determine which sense resistor is coupled to the voltage measurement device 118. The processor circuitry 112 can be configured to receive a signal generated by the voltage measurement device 118, and can be configured to change the dimensions or otherwise interpret the signal from the voltage measurement device 118. For example, the voltage measurement device 118 may produce a signal in arbitrary units (e.g., a digital signal from an ADC), and the processor circuitry 112 can process the signal to determine a voltage in unit, such as volts.

An input impedance of the voltage measurement circuitry 110, such as can include an input impedance of one or more of the multiplexer 116 or the voltage measurement device 118, can be configured to have a specified value. The input impedance of the voltage measurement circuitry 110 can be configured to be large (e.g., greater than 100 kiloohms, greater than 1 megaohm, greater than 10 megaohms), such as to reduce a current through the measurement leads of the sense resistors. An increased input impedance of the voltage measurement circuitry 110 can help to reduce or otherwise tailor an effect the voltage measurement circuitry 110 has on the voltage across one or more sense resistors, increase or otherwise tailor an accuracy or specificity of a voltage measured by the voltage measurement circuitry 110, or both. In an example, the input impedance of the voltage measurement circuitry 110 can be configured to be large as compared to the impedance of one or more of the sense resistors, such as can include 100 times larger, 1,000 times larger, or 10,000 times larger.

The processor circuitry 112 can be configured to calculate the current through the cell arrangement 102 by calculating respective currents through corresponding ones of the sense resistors and summing the respective currents. The processor circuitry 112 can determine the current through a sense resistor by dividing the voltage across the sense resistor by the resistance value of the sense resistor. The resistance value can be a specified, determined, or calibrated value. For example, the processor circuitry 112 can have calibrated resistance values for the first sense resistor 106 and the second sense resistor 108 stored in memory, and can use these values when determining a current through the corresponding sense resistor. Equation 1 shows an example of an equation for determining the current through the parallel arrangement of a plurality of sense resistors 104.

$$I = V_{106}/R_{106} + V_{108}/R_{108} \qquad \text{Equation 1}$$

In equation 1, V_106 is the voltage across the first sense resistor 106, R_106 is the resistance value of the first sense resistor 106, V_108 is the voltage across the second sense resistor 108, and R_108 is the resistance value of the second sense resistor 108. Equation 1 shows an example of measuring DC current. In an example using AC current, the voltage values can be AC voltage values (e.g., complex RMS voltage) at a specified frequency, and the resistance values can be substituted for complex impedance values at the specified frequency (e.g., resistance and reactance at the specified frequency). The processor circuitry 112 can be configured to measure an AC current through the cell arrangement 102 across a range of frequencies. This can include measuring a voltage across the first sense resistor 106 and the second sense resistor 108 across the specified range of frequencies, and determining the current at each frequency, such as according to Equation 1. The processor circuitry 112 can measure one or more frequencies at one time (e.g., a spectrum), or can take measurements for each frequency range or frequencies at discrete times. In an example, the current value can be a complex current value, such as can include an indication of a phase of the current.

The processor circuitry 112 can be configured to cause the voltage measurement circuitry 110 to measure the current through the first sense resistor 106 a specified length of time from measuring the current through the second sense resistor 108. If the specified length of time is short with respect to a rate of change of a current in the cell arrangement 102 (e.g., if the current through the cell arrangement 102 changes minimally over a one second timespan, one-tenth of a second can be short with respect to the rate of change), summing the measured currents through the first sense resistor 106 and the second sense resistor 108 that occurred at different times can result in an accurate approximation of the current through the cell arrangement 102 at a specific time.

The test current source or sink 114 can provide a test current through the cell arrangement 102, such as to make one or more EIS measurements (e.g., forcing the cell arrangement 102 with a specific frequency or range of frequencies and measuring the response, such as to determine an EIS parameter). The test current source or sink 114 can be configured to provide a test current to the cell arrangement 102 and to the parallel arrangement of a plurality of sense resistors 104. The test current source or sink 114 can be coupled to the processor circuitry 112. The processor circuitry 112 can cause the test current source or sink 114 to generate a test current. The processor circuitry 112 can then determine a current through the cell arrangement 102, such as by determining a current through the parallel arrangement of a plurality of sense resistors 104, as discussed above. The current through the cell arrangement 102 can be used, such as used in conjunction with a voltage across the cell arrangement 102, to determine an EIS parameter of the cell arrangement 102.

The test current source or sink 114 can provide a configurable test current, such as can be configured by a user, the processor circuitry 112, or both. The test current source or sink 114 can provide an AC test current, a DC test current, or both. The test current source or sink 114 can provide a test current of a specified magnitude. The test current source or sink 114 can provide an AC test current of a specified waveform. For example, the test current source or sink 114 can provide an AC test current that is one or more of a sine wave, a square wave, a triangle wave, a sawtooth wave, or any other waveform. In an example, a square wave can be used, such as to force the cell arrangement 102 across a range of frequencies (e.g., the frequency composition of the square wave).

FIG. 2 is a schematic drawing of an example of portions of a current measurement system 100. In the example of FIG. 2, the voltage measurement circuitry 110 can include a plurality of voltage measurement devices (e.g., voltage measurement device 118, second voltage measurement device 218), respectively coupled to corresponding individual ones of the sense resistors (e.g., first sense resistor 106, second sense resistor 108). The second voltage measurement device 218 can be configured similarly to the voltage measurement device 118, or can differ in one or more ways. The voltage measurement device 118 can be coupled to the first sense resistor 106, and the second voltage measurement device 218 can be coupled to the second sense resistor 108. The processor circuitry 112 can be coupled to the voltage measurement device 118 and the second voltage measurement device 218 to receive a signal from each of the second voltage measurement device 218 and the voltage measurement device 118.

In the example of FIG. 2, the voltage measurement circuitry 110 can measure a voltage across the first sense resistor 106 and the second sense resistor 108 simultaneously, or at least partially concurrently, such as where neither the voltage measurement device 118 or the second voltage measurement device 218 are shared between two or more sense resistors. This can increase an accuracy of the determined current through the parallel arrangement of a plurality of sense resistors 104, reduce a time that it takes to make a measurement, or both. In an example, the voltage measurement circuitry 110 can be configured to measure a voltage across one or more cells in the cell arrangement 102, such as can include a voltage across the cell arrangement 102.

In an example where there are more than two sense resistors in the parallel arrangement of a plurality of sense resistors 104, each of the sense resistors can have their own corresponding voltage measurement device. In an example, there can be two or more voltage measurement devices, but one voltage measurement device can be shared between two or more sense resistors. For example, there can be four sense resistors and two voltage measurement devices, and each of the voltage measurement devices can be shared between two sense resistors, such as using a multiplexer, such as similar to the voltage measurement circuitry 110 of FIG. 1. In this example, the time to measure the voltage across all of the sense resistors can be reduced as compared to a system with a single voltage measurement device, but the complexity of the circuit can be reduced as compared to a system with a voltage measurement device for each sense resistor.

Figure 3:
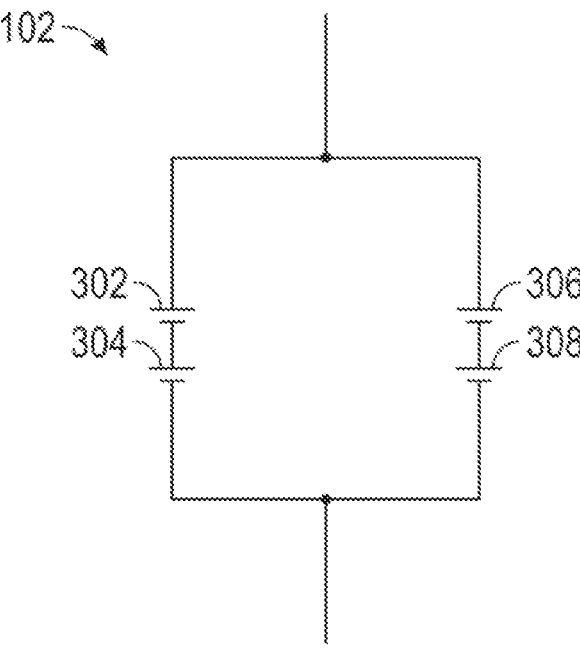
FIG. 3 is a schematic drawing of an example of portions of a cell arrangement.

FIG. 3 is a schematic drawing of an example of portions of a cell arrangement 102. The cell arrangement 102 can include a first electrochemical cell 302, a second electrochemical cell 304, a third electrochemical cell 306, and a fourth electrochemical cell 308. FIG. 3 shows that the cell arrangement 102 can include at least one of a series arrangement or parallel arrangement of at least two electrochemical cells. In the example of FIG. 3, the cell arrangement 102 includes a combination of series cell arrangements (e.g., the first electrochemical cell 302 in a first series arrangement with the second electrochemical cell 304, the third electrochemical cell 306 in a second series arrangement with the fourth electrochemical cell 308) and parallel arrangements (e.g., the first series arrangement in parallel with the second series arrangement) of at least four electrochemical cells.

The electrochemical cells in the cell arrangement 102 can be arranged in any fashion. In an example, the first electrochemical cell 302 can be in a first parallel arrangement with the third electrochemical cell 306 and the second electrochemical cell 304 can be in a second parallel arrangement with the fourth electrochemical cell 308. In this example, the first parallel arrangement could be arranged in series with the second parallel arrangement.

FIG. 4 shows an example of portions of a method 400 for operating a current measurement system, such as the current measurement system 100. Method 400 can be a method for measuring a current through a cell arrangement including one or more electrochemical cells.

At step 402, respective voltages corresponding to respective ones of a plurality of sense resistors can be measured, the sense resistors in a parallel arrangement, the parallel arrangement in series with the cell arrangement. For example, the voltage corresponding to (e.g., across) the first sense resistor 106 can be measured and the voltage corresponding to the second sense resistor 108 can be measured.

At step 404 measuring respective voltages can include measuring at least two voltages at least partially concurrently. For example, the voltage across the first sense resistor 106 can be measured by the voltage measurement device 118 at least partially concurrently with the voltage across the second sense resistor 108 being measured by the second voltage measurement device 218.

At step 406, measuring respective voltages can include measuring at least two voltages using a shared voltage measurement device. The shared voltage measurement device can include a single voltage measurement device to measure a voltage corresponding to each of the plurality of sense resistors individually before the summing of the calculated respective current values. For example, the voltage measurement device 118 of FIG. 1 can be shared between the first sense resistor 106 and the second sense resistor 108, and can measure a voltage across both sense resistors (e.g., using the multiplexer 116) before the processor circuitry 112 calculates and sums respective current values corresponding to the first sense resistor 106 and the second sense resistor 108.

At step 408, respective current values corresponding to respective ones of the plurality of sense resistors can be calculated, such as using the measured respective voltages and specified resistances of the respective ones of the plurality of sense resistors. For example, the current through the first sense resistor 106 can be calculated by dividing the measured voltage across the first sense resistor 106 by the specified resistance of the first sense resistor 106. The current through the second sense resistor 108 can be calculated by dividing the voltage across the second sense resistor 108 by the specified resistance of the second sense resistor 108.

At step 410, the calculated respective current values can be summed, such as to determine the current through the cell arrangement. For example, the calculated current through the first sense resistor 106 can be summed with the calculated current through the second sense resistor 108 to determine the current through the parallel arrangement of a plurality of sense resistors 104.

At step 412, the determined current through the cell arrangement can be used in EIS system, such as to determine an EIS parameter. For example, the processor circuitry 112 can use the current through the parallel arrangement of a plurality of sense resistors 104 to determine an EIS parameter of the cell arrangement 102, such as in conjunction with a determined voltage across the cell arrangement 102. In an example, the method 400 can include recurrently determining the current through the cell arrangement at a specified interval, such as by repeating step 402, step 408, and step 410.

The shown order of steps is not intended to be a limitation on the order in which the steps are performed. In an example, two or more steps may be performed simultaneously or at least partially concurrently.

DC Current Measurement

The present inventors have recognized, among other things, that the DC current through an electrochemical cell can have a significant impact on an EIS measurement. The DC component of the electrochemical cell current can affect the impedance spectrum of the cell (e.g., the same cell can exhibit a different impedance based on the DC component of the operating current) and its interpretation. This can make it desirable to determine the DC component of the current as part of the EIS measurement.

The determined DC component of the current through the electrochemical cell can be used in addition to the AC component of the current through the electrochemical cell to make one or more EIS measurements. For example, the DC component of the current can be used in determining the SoC, SoH, or both, of a cell arrangement.

In an example, the voltage measurement circuitry 110 of FIG. 1 can determine the DC component of the current through the parallel arrangement of a plurality of sense resistors 104, alternatively or in addition to determining the AC component of the current through the parallel arrangement of a plurality of sense resistors 104. For example, the voltage measurement device 118 can be configured to determine the DC component of a voltage alternatively or in addition to the AC component of the voltage. In an example, the voltage measurement device 118 can be configured to determine the DC component and the AC component simultaneously, or at least partially concurrently. In an example, the voltage measurement device 118 can be configured to determine the DC component and the AC component in sequence, such as can include first determining the DC component and then determining the AC component. For example, the voltage measurement device 118 can include circuitry to configure the voltage measurement device 118 to measure the AC component or the DC component, and this configuration can be adjusted based on the component being measured.

Figure 5:
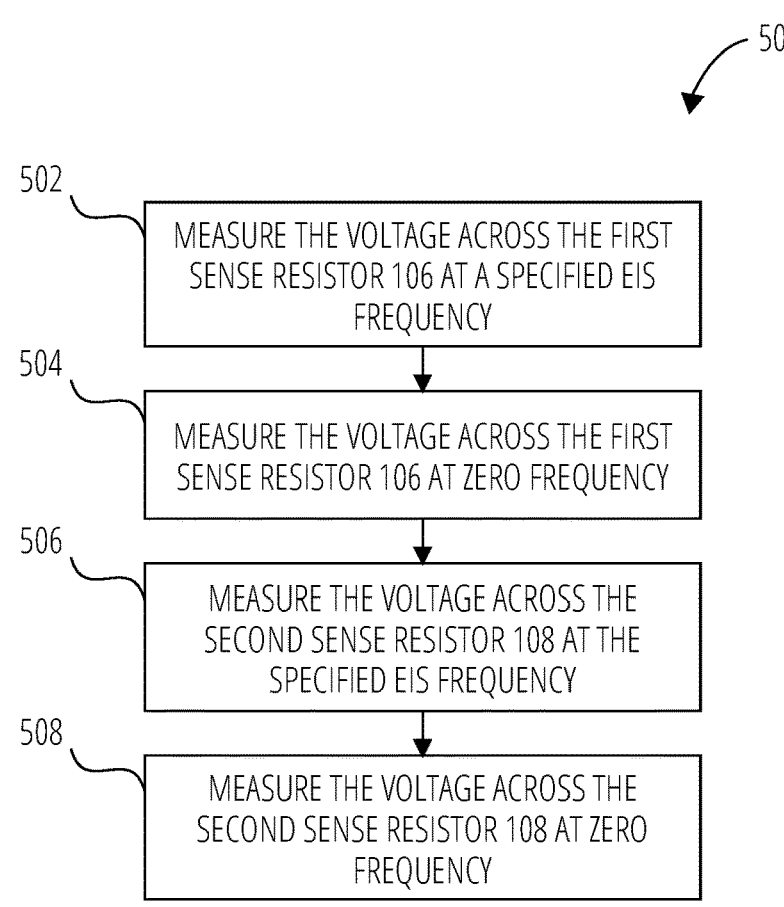
FIG. 5 shows an example of portions of a method for operating a current measurement system.

In an example, the voltage measurement device 118 can be configured to measure the AC component at a specified frequency or range of frequencies (e.g., a spectrum). This specified frequency or specified range of frequencies can be configurable, such as by the processor circuitry 112. The specified frequency or range of frequencies can be selected based upon a frequency or range of frequencies output by the test current source or sink 114 (e.g., matching the output of the test current source or sink 114, overlapping with the output of the test current source or sink 114). In an example, the voltage measurement device 118 can be configured to measure the DC component of the voltage, such as by selecting a frequency of zero (e.g., the theoretical frequency of a DC signal). FIG. 5 shows an example of a method 500 of using the current measurement system 100 of FIG. 1 to determine the AC component of the current through the cell arrangement 102 in addition to the DC component of the current through the cell arrangement 102.

At step 502, the AC component of the voltage across the first sense resistor 106 at a specified EIS frequency (e.g., the EIS measurement frequency) can be measured. For example, the multiplexer 116 can be configured to couple the voltage measurement device 118 across the first sense resistor 106, and the voltage measurement device 118 can be configured to measure at the specified EIS frequency.

At step 504, the voltage across the first sense resistor 106 at zero frequency can be measured. For example, the multiplexer 116 can be configured to couple the voltage measurement device 118 across the first sense resistor 106, and the voltage measurement device 118 can be configured to measure at zero frequency, or otherwise configured to measure the DC component of the voltage.

At step 506, the voltage across the second sense resistor 108 at the specified EIS frequency can be measured. For example, the multiplexer 116 can be configured to couple the voltage measurement device 118 across the second sense resistor 108, and the voltage measurement device 118 can be configured to measure at the specified EIS frequency.

At step 508, the voltage across the second sense resistor 108 at zero frequency can be measured. For example, the multiplexer 116 can be configured to couple the voltage measurement device 118 across the second sense resistor 108, and the voltage measurement device 118 can be configured to measure at zero frequency, or otherwise configured to measure the DC component of the voltage.

One or more portions of the method 500 can performed in conjunction with or as a part of one or more steps of the method 400. For example, steps 502-508 can be performed as a portion of step 402. Steps 408-412 can include determining the DC component of the current in addition to the AC component at the specified EIS frequency. For example, steps 408-412 can be performed twice, once respectively for each of the DC component and the AC component.

The shown order of steps is not intended to be a limitation on the order in which the steps are performed. In an example, two or more steps may be performed simultaneously or at least partially concurrently.

In an example, the current measurement system 100 of FIG. 2 can be used to measure the DC component of the current through the cell arrangement 102, alternatively or in addition to the AC component. For example, the voltage measurement device 118 and the second voltage measurement device 218 can be configured to measure the DC component of a voltage in addition to the AC component of the voltage, such as partially concurrently or in sequence, such as described above. Additionally or alternatively to the examples discussed above, the DC component of the current can be measured at least in part using separate circuitry from the circuitry used to measure the AC component of the current.

Figure 6:
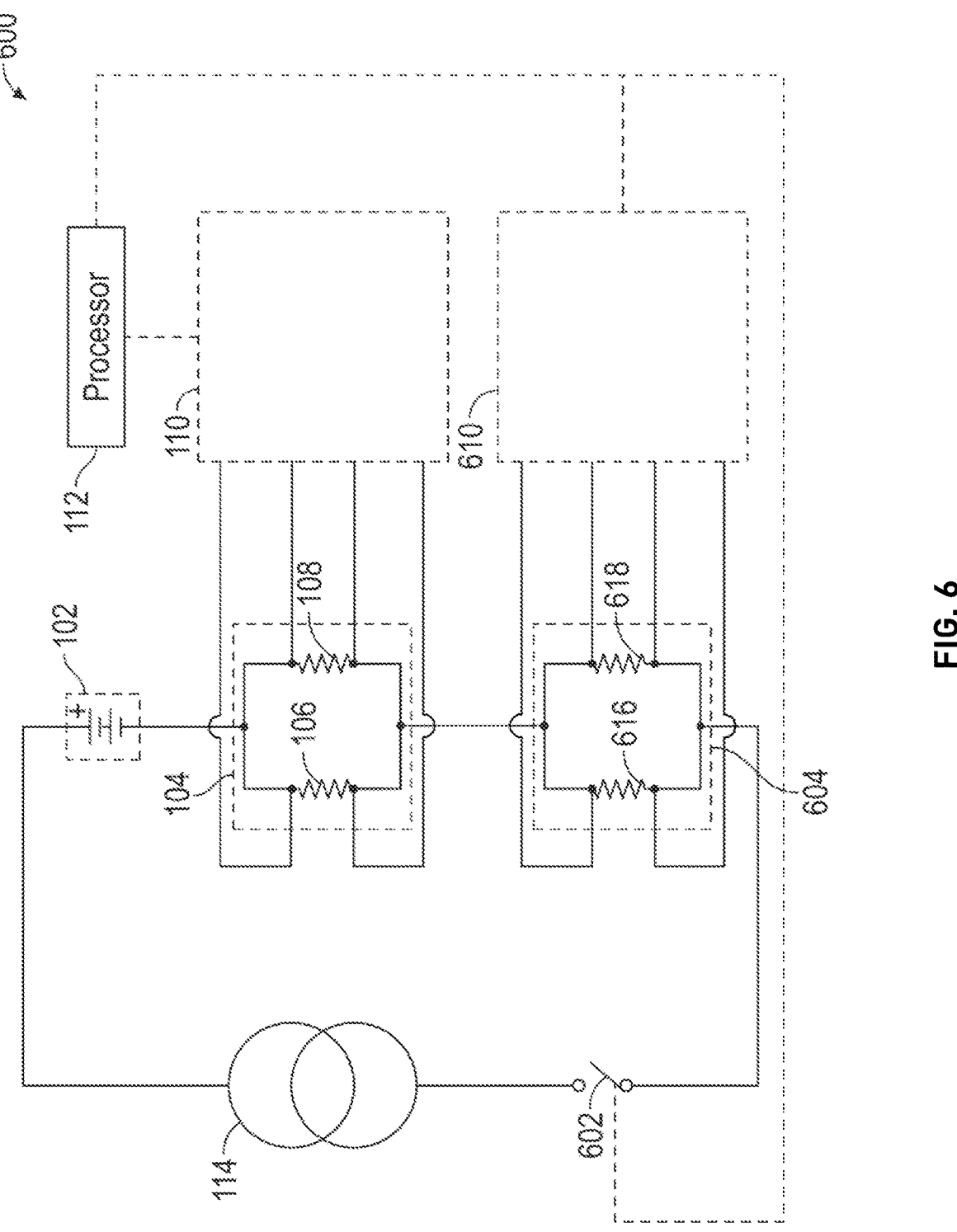
FIG. 6 is a schematic drawing of an example of portions of a current measurement system.

FIG. 6 is a schematic drawing of an example of portions of a current measurement system 600. The current measurement system 600 can be configured similarly to the current measurement system 100, or can differ in one or more ways. FIG. 6 shows that the current measurement system 600 can include a sense resistor arrangement 604, a second voltage measurement circuitry 610, and a disconnect switch 602 in addition to the components of the current measurement system 100. In an example, the second voltage measurement circuitry 610 can be configured to measure the DC component of the voltage across the sense resistor arrangement 604, and the voltage measurement circuitry 110 can be configured to measure the AC component of the voltage across the parallel arrangement of a plurality of sense resistors 104. The processor circuitry 112 can be configured to determine the DC component of the current through the cell arrangement 102 using the information from the second voltage measurement circuitry 610 and the AC component of the current through the cell arrangement 102 using the information from the voltage measurement circuitry 110.

The sense resistor arrangement 604 can be placed in series with the cell arrangement 102. The sense resistor arrangement 604 can include a single sense resistor, or can include an arrangement of two or more sense resistors. The sense resistor arrangement 604 can be configured similarly to the parallel arrangement of a plurality of sense resistors 104, or can differ in one or more ways. The sense resistor arrangement 604 can include two or more sense resistors in a parallel arrangement, such as can include a third sense resistor 616 and a fourth sense resistor 618. The third sense resistor 616 and the fourth sense resistor 618 can be configured similarly to the first sense resistor 106 and the second sense resistor 108, or can differ in one or more ways. The third sense resistor 616 and the fourth sense resistor 618 can be configured to have the same or similar resistance values, or can be configured to have a different resistance value from each other. The third sense resistor 616 and the fourth sense resistor 618 can be configured to have the same or similar resistance values to the first sense resistor 106 and the second sense resistor 108, or can be configured to have differing resistance values.

The sense resistor arrangement 604 can be configured to have a similar effective resistance value to the parallel arrangement of a plurality of sense resistors 104, or can be configured to have a different effective resistance value. For example, the sense resistor arrangement 604 can be configured to have a smaller effective resistance than the parallel arrangement of a plurality of sense resistors 104, such as can include at least two times smaller, at least four times smaller, at least 10 times smaller, or at least 100 times smaller. The effective resistance of the parallel arrangement of a plurality of sense resistors 104 and the sense resistor arrangement 604 can be configured to provide a specified voltage across the arrangements under specified conditions, such as can increase or otherwise tailor the voltage to an effective range of the voltage measurement circuitry 110 or the second voltage measurement circuitry 610, such as can increase an accuracy, signal-to-noise ratio, or both.

The cell arrangement 102 can primarily operate in a DC state. The test current source or sink 114 can primarily operate in an AC state. This can result in the DC component of the current being larger than the AC component of the current during some operating times. The amplitude of the test current can be less than an amplitude of the DC current through the cell arrangement 102. For example, the DC current through the cell arrangement 102 can be or reach 3000 amperes, and the test current generated by the test current source or sink 114 can be between one and 150 amperes. This can result in the AC component of the current through the cell arrangement 102 being less than the DC component of the current, such as can make it desirable to have sense resistor arrangements with differing resistances. For example, if a desired measurement voltage of two volts is desired, and the DC component of the current is 20 times the AC component of the current, a DC sense resistor would need to be 20 times smaller than an AC sense resistor generating a two-volt AC signal for the DC sense resistor to generate a two volt DC signal.

In an example, the sense resistor arrangement 604 can include a single sense resistor. For example, determining the DC component of the current through the sense resistor arrangement 604 can be less affected by an inductance of the sense resistor arrangement 604 than determining the AC component of the current through the parallel arrangement of a plurality of sense resistors 104 is affected by an inductance of the parallel arrangement of a plurality of sense resistors 104. The power dissipated in the sense resistor arrangement 604 can be lower than the power dissipated in the parallel arrangement of a plurality of sense resistors 104, such as due to a lower resistance of the sense resistor arrangement 604.

The second voltage measurement circuitry 610 can be configured to measure a voltage across the sense resistor arrangement 604, including to measure at least a DC component of the voltage. In an example, the current through the sense resistor arrangement 604 has a DC component and an AC component, such as can be due to an AC current from the test current source or sink 114 and a DC current from a load or power source (e.g., a motor load, a charging power source, an electrolysis power source). The second voltage measurement circuitry 610 can be configured similarly to the voltage measurement circuitry 110, or can differ in one or more ways. For example, the second voltage measurement circuitry 610 can be configured to measure a DC component of the received voltage, and the voltage measurement circuitry 110 can be configured to measure an AC component of the received voltage.

The second voltage measurement circuitry 610 can measure a DC component of the received voltage, such as by filtering out an AC component of the voltage, averaging the received voltage, or both. For example, the second voltage measurement circuitry 610 can be configured to filter out a portion of a received AC component of the voltage, such as using a low-pass filter. The low-pass filter can be implemented in the digital domain, the analog domain, or both. For example, the processor circuitry 112 can average two or more values measured by the second voltage measurement circuitry 610 to determine the DC component of the voltage.

The voltage measurement circuitry 110 can be configured to measure an AC component of the received voltage, such as by filtering out a DC component of the voltage. For example, the voltage measurement circuitry 110 can be configured to be AC coupled (e.g., using a capacitor). In an example, the voltage measurement circuitry 110 can be configured to filter out a portion of the received DC component of the voltage, such as using a high-pass filter. The high-pass filter can be implemented in the digital domain, the analog domain, or both. For example, the processor circuitry 112 can process a series of received values from the voltage measurement device 118 to determine the AC component of the voltage at a specified frequency (e.g., using a digital filter, using Fourier analysis).

In an example, one or more of the second voltage measurement circuitry 610 or the voltage measurement circuitry 110 can be configured to measure an AC component of the voltage and a DC component of the voltage (e.g., determining an AC component of the voltage in addition to determining a DC component of the voltage. For example, the voltage measurement circuitry 110 can determine the DC component of the voltage (e.g., the average voltage) and one or more AC components of the voltage (e.g., the amplitude of the AC voltage at a specified EIS frequency.)

In an example, the second voltage measurement circuitry 610 can also be coupled to the parallel arrangement of a plurality of sense resistors 104, such as can result in the second voltage measurement circuitry 610 measuring the voltage across the first sense resistor 106 and the second sense resistor 108. In this example, the voltage measurement circuitry 110 and the second voltage measurement circuitry 610 can take measurements simultaneously or at least partially concurrently.

In an example, the second voltage measurement circuitry 610 can be configured to measure respective voltages across corresponding ones of the sense resistors in the sense resistor arrangement 604, such as can be similar to the operation of the voltage measurement circuitry 110 discussed above. In an example, the second voltage measurement circuitry 610 can be configured to measure an AC component of the voltage in addition to the DC component, such as discussed above. In this example, the parallel arrangement of a plurality of sense resistors 104 and the voltage measurement circuitry 110 may be omitted.

In an example, the processor circuitry 112 can be coupled to the second voltage measurement circuitry 610, the voltage measurement circuitry 110, or both. The processor circuitry 112 can be configured to calculate a DC component of the current through the cell arrangement 102, such as using the information from the second voltage measurement circuitry 610, such as using the methods discussed above. In an example, the processor circuitry 112 can be configured to calculate an AC component of the current through the cell arrangement 102, such as using the information from the voltage measurement circuitry 110, such as using the methods discussed above.

In an example, the current measurement system 600 can include a disconnect switch 602. The disconnect switch 602 can be configured to open (e.g., disconnect the terminals of the switch) when the measured DC component (e.g., as determined by the processor circuitry 112) exceeds a specified threshold. For example, one or more components of the current measurement system 600 (e.g., cabling, buswork, the cell arrangement 102, the parallel arrangement of a plurality of sense resistors 104, the test current source or sink 114, the sense resistor arrangement 604), may have a specified current rating. The lowest current rating of the components in series with the cell arrangement 102 can be used as the specified threshold. The processor circuitry 112 can be configured to open the disconnect switch 602 when the rating of one or more components is exceeded, such as to interrupt the flow of current through one or more components.

Figure 7:
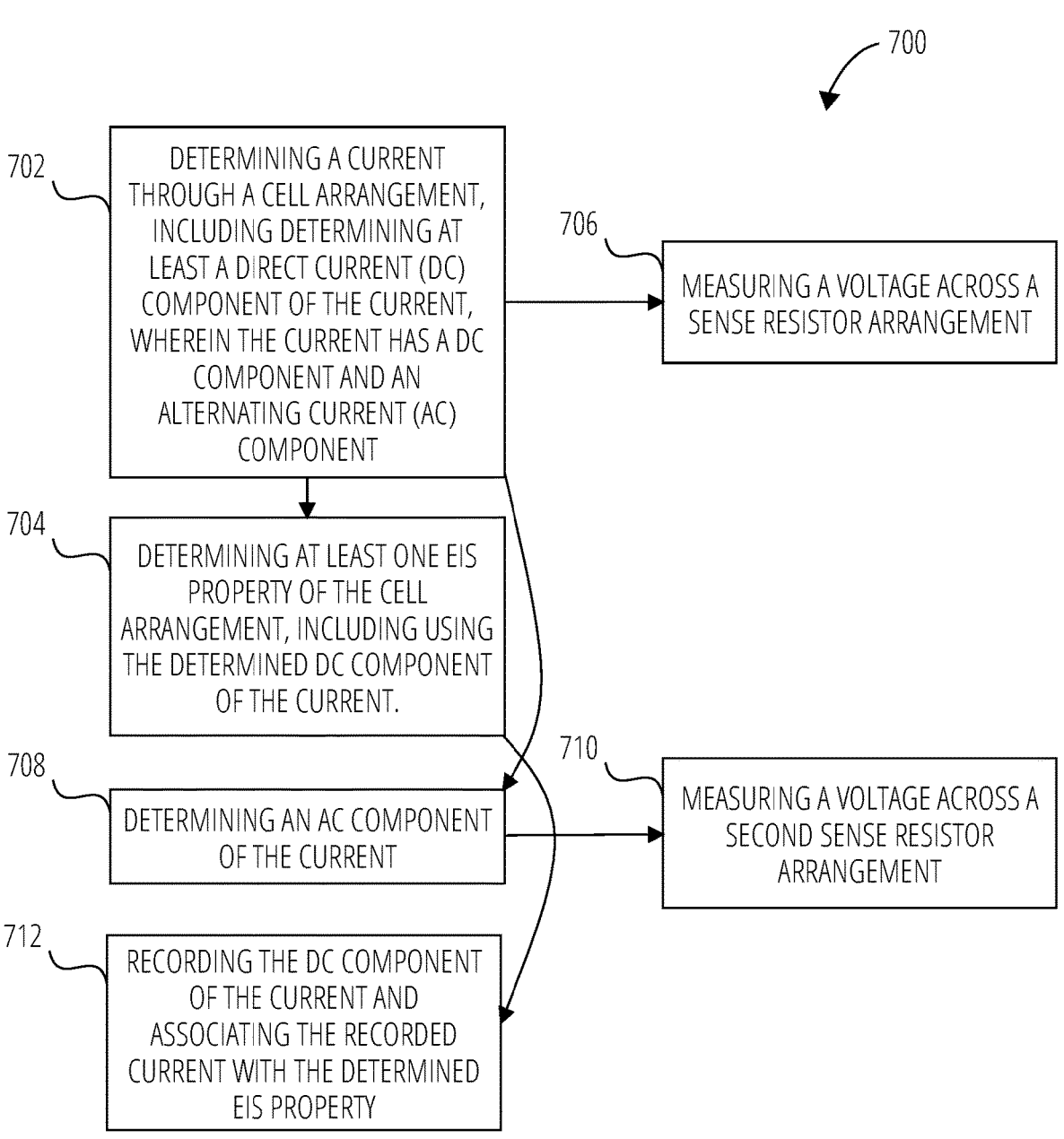
FIG. 7 shows an example of portions of a method for operating a current measurement system.

FIG. 7 shows an example of portions of a method 700 for operating a current measurement system, such as the current measurement system 600. Method 700 can be a method for making an EIS measurement for a cell arrangement including one or more electrochemical cells (e.g., the cell arrangement 102). At step 702, a current through the cell arrangement can be determined, such as can include determining at least a DC component of the current, such as where the current has a DC component and an AC component.

At step 704, at least one EIS property of the cell arrangement can be determined, such as using the determined DC component of the current. For example, an EIS property of the cell arrangement 102 can be determined. The EIS property can include one or more of SoH, SoC, or any other property. The EIS property can be determined as a function of the DC component of the current and an impedance of the cell arrangement 102 at one or more EIS frequencies. The determined EIS property can be used for one or more of diagnostics, troubleshooting, preventative maintenance scheduling, emergency shutdown, or any other use.

At step 706, determining the DC component of the current through the cell arrangement can include measuring a voltage across a sense resistor arrangement. The sense resistor arrangement can be arranged in series with the cell arrangement. The current can be determined by dividing a voltage across the sense resistor arrangement by a resistance value of the sense resistor arrangement. For example, the second voltage measurement circuitry 610 can measure a DC voltage across the sense resistor arrangement 604, and the processor circuitry 112 can determine a DC current through the cell arrangement 102 based on the measured voltage and the resistance value of the sense resistor arrangement 604. The current through the cell arrangement 102 can have an AC component (e.g., due to the test current source or sink 114) and a DC component (e.g., due to a power source or a load).

In an example, measuring the voltage across the sense resistor arrangement can include measuring respective voltages corresponding to respective ones of a plurality of sense resistors in a parallel arrangement comprising the sense resistor arrangement, such as discussed above. Calculating the current through the sense resistor arrangement can include calculating respective current values corresponding to respective ones of the plurality of sense resistors, such as can include using the measured respective voltages and specified resistances of the respective ones of the plurality of sense resistors, and summing the calculated respective current values to determine the current through the cell arrangement.

At step 708, an AC component of the current through the cell arrangement can be determined. At step 710, determining an AC component of the current through the cell arrangement can include determining a second current through a second sense resistor arrangement, such as by measuring a second voltage across a second sense resistor arrangement, where the second sense resistor arrangement can be series with the cell arrangement. For example, the parallel arrangement of a plurality of sense resistors 104 can be placed in series with the cell arrangement 102, and the voltage measurement circuitry 110 can measure an AC component of the voltage across the parallel arrangement of a plurality of sense resistors 104. The processor circuitry 112 can determine the AC component of the current through the cell arrangement 102 based on the resistance of the parallel arrangement of a plurality of sense resistors 104 and the voltage measured by the voltage measurement circuitry 110.

In an example, measuring the voltage across the sense resistor arrangement includes using first voltage measurement circuitry and the measuring the second voltage across the second sense resistor arrangement includes using second voltage measurement circuitry. For example, the second voltage measurement circuitry 610 can be used to measure the voltage across the sense resistor arrangement 604 and the voltage measurement circuitry 110 can be used to measure the voltage across the parallel arrangement of a plurality of sense resistors 104.

In an example, measuring the voltage across the sense resistor arrangement and measuring the second voltage across the second sense resistor arrangement can occur at least partially concurrently. For example, the second voltage measurement circuitry 610 can measure the voltage across the sense resistor arrangement 604 at least partially concurrently with the voltage measurement circuitry 110 measuring the voltage across the parallel arrangement of a plurality of sense resistors 104.

In an example, measuring the DC component of the current and the AC component of the current can occur at different times. For example, the voltage measurement circuitry 110 can be used to measure both the DC component and the AC component of the current, and can take the measurements at different times, such as due to a reconfiguration of the voltage measurement circuitry 110 (e.g., reconfiguring the multiplexer 116, the voltage measurement device 118, or the second voltage measurement device 218) between AC and DC voltage measurements.

At step 712, the DC component of the current can be recorded and associated with the determined EIS property. For example, the processor circuitry 112 can determine an EIS property of the cell arrangement 102, such as using the determined DC component of the current and a determined AC component at a specified EIS frequency, and the processor circuitry 112 can report, record, or both, the determined EIS property along with the DC component of the current. This DC component of the current can later be referenced, such as to infer information about the determined EIS property, adjust the EIS property, or both.

In an example, the method 700 can include using the determined DC component to compensate for a non-ideality of at least one component of the current measurement system. The DC component can be used to compensate for an inductance of the sense resistor arrangement. For example, the inductance of the sense resistor arrangement can increase as the DC component of the current through the sense resistor arrangement increases. This can affect the determined AC component of the current measured through the sense resistor arrangement, such as unless the determination of the AC component is adjusted for the change in inductance. For example, a larger inductance can result in a larger impedance of the sense resistor arrangement, such as can increase a determined AC component of the current if lower impedance (e.g., corresponding to a lower or zero DC component of the current) is used. Determining or estimating the impedance of the sense resistor arrangement used in determining the AC component of the current, such as a function of the DC component of the current, can affect the accuracy of the determined AC component.

The shown order of steps is not intended to be a limitation on the order in which the steps are performed. In an example, two or more steps may be performed simultaneously or at least partially concurrently.

Current Measurement System Calibration

The present inventors have recognized, among other things, that the reactance of a sense resistor arrangement (e.g., capacitance, inductance) can affect the accuracy of an EIS measurement. For example, the impedance of an electrolysis cell can be measured at a higher frequency than another electrochemical cell (e.g., battery cell, fuel cell) during an EIS measurement. This can increase an effect that the reactance has on one or more EIS measurements. For example, the reactance due to capacitance can be inversely proportional to frequency, and the reactance due to inductance can be proportional to frequency. Determining, estimating, or calibrating the reactance of the sense resistor arrangement can help increase an accuracy of or otherwise tailor a measurement of the current measurement system.

The present inventors have recognized, among other things, systems and methods for calibrating a current measurement system, such as to calibrate a sense resistor arrangement. Calibrating the sense resistor arrangement can include determining a resistance of the sense resistor arrangement, determining a reactance of the sense resistor arrangement, or both. The present inventors have recognized, among other things, that the resistance, reactance, or both, of calibration elements may vary across frequency. While one or the resistance or reactance of a calibration element can be consistent across a frequency range or have a specified value at each of a number of frequencies, the other of the resistance or reactance may not be well defined. For example, the reactance of a calibration resistor may not be well defined or can vary across frequencies. The resistance of a calibration inductor may not be well defined or can vary across frequencies. The present disclosure describes systems and methods of determining a calibrated resistance value and a calibrated reactance value of a sense resistor arrangement using a calibration resistor with a specified resistance and an unspecified reactance and a reactive element with a specified reactance and an unspecified resistance.

Figure 8:
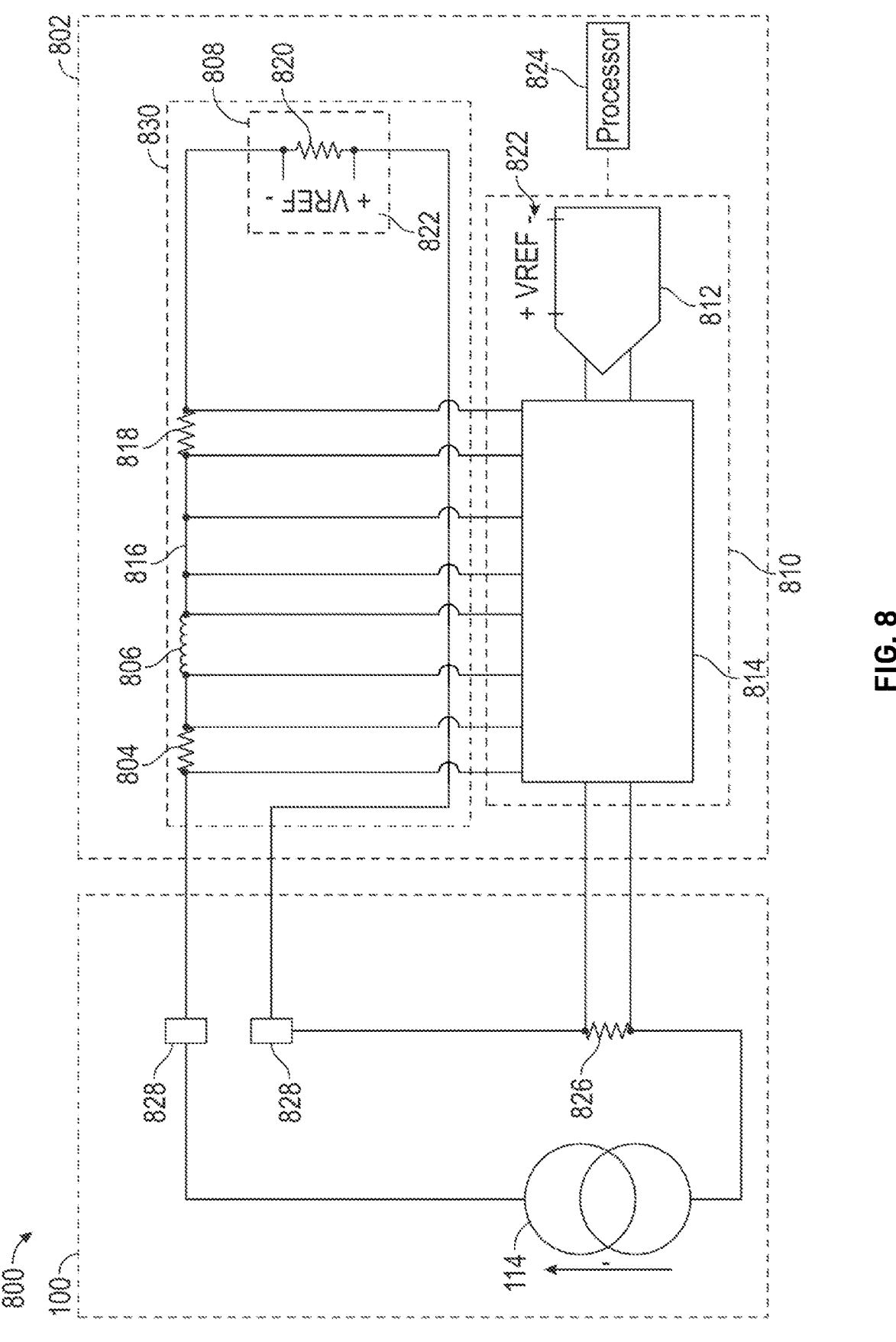
FIG. 8 is a schematic drawing of an example of portions of a calibration system.

FIG. 8 is a schematic drawing of an example of portions of a calibration system 800. The calibration system 800 can be configured for calibrating a current measurement system 100, such as can include calibrating a sense resistor arrangement 826 of the current measurement system 100. For example, the calibration system 800 can determine a calibrated resistance value, a calibrated reactance value, or both, of the sense resistor arrangement 826. The calibrated resistance value and the calibrated reactance value can also include one or more parasitic effects of the installation of the current measurement system 100, such as due to performing the calibration of the current measurement system 100 in the location of installation. The calibration system 800 can include a calibration board 802. The calibration board 802 can include a calibration resistor 804, a reactive element 806, a short circuit component 816, a fourth circuit element 818, a current source 808, voltage measurement circuitry 810, and a processor 824.

One or more of the calibration resistor 804, the reactive element 806, the short circuit component 816, the fourth circuit element 818, or the current source 808 can be arranged in series, such as to form a calibration loop 830. The calibration board 802 can be connected to portions of the current measurement system 100. The calibration loop 830 can be arranged in series with portions of the current measurement system 100, such as one or more of the sense resistor arrangement 826 or the test current source or sink 114. The calibration loop 830 can be coupled to the current measurement system 100 in place of the cell arrangement 102. For example, respective ends of the calibration loop 830 can be coupled to the cell arrangement connection terminals 828. This can allow the calibration system 800 to calibrate the current measurement system 100 in the location of use, such as with limited reconfiguration for calibration. Allowing the current measurement system 100 to be calibrated in the location of use can provide for one or more of a more accurate or otherwise tailored calibration, which can be due to the parasitic effects of one or more components of the current measurement system 100 (e.g., buswork, enclosures).

One or more of the calibration resistor 804, the reactive element 806, the short circuit component 816, or the fourth circuit element 818 can be configured to have their respective voltages (e.g., a voltage across the respective elements) measured by the voltage measurement circuitry 810. The measurement terminals of the sense resistor arrangement 826 can be coupled to the voltage measurement circuitry 810, such as to allow the voltage measurement circuitry 810 to measure a voltage across the sense resistor arrangement.

The voltage measurement circuitry 810 can be configured to generate a signal corresponding to one or more of the input voltages. The voltage measurement circuitry 810 can include a multiplexer 814 and an analog-to-digital converter (ADC) 812. The multiplexer 814 can be coupled to one or more elements, such as one or more of the calibration resistor 804, the reactive element 806, the short circuit component 816, the fourth circuit element 818, or the sense resistor arrangement 826. The multiplexer 814 can be configured to selectably connect individual ones of the elements to the ADC 812. The multiplexer 814 can be controlled by the processor 824.

The ADC 812 can be configured to generate a digital output signal corresponding to an analog input signal. The analog input signal can be in the form of a voltage. The digital output signal can be any form of digitized signal. The digital output signal can be passed to the processor 824. The ADC 812 can receive a reference voltage 822, VREF. The reference signal can be used to generate the digital output signal. For example, the digital output signal can correspond to the ratio of the analog input signal to the reference voltage 822.

The current measurement system 100 can be configured similarly to the current measurement system 100 of FIG. 1 or FIG. 2, or can differ in one or more ways. In an example, the current measurement system 100 can be configured similarly to the current measurement system 600 of FIG. 6.

The sense resistor arrangement 826 can be configured similarly to the parallel arrangement of a plurality of sense resistors 104, or can differ in one or more ways. In the example of FIG. 8, the sense resistor arrangement 826 includes a single sense resistor. However, as discussed above, the sense resistor arrangement 826 can include a plurality of sense resistors, such as in a parallel arrangement. The sense resistor arrangement 826 can be used by the current measurement system 100 to measure a current, such as measuring a current through a cell arrangement coupled between the cell arrangement connection terminals 828. The sense resistor arrangement 826 can have a resistance, a reactance, or both. Determining the resistance, reactance, or both, of the sense resistor arrangement 826 can help allow the current measurement system 100 to make more accurate or otherwise tailored current measurements. The calibration system 800, such as using the calibration board 802, can be configured to measure, calibrate, or otherwise estimate the resistance, reactance, or both, of the sense resistor arrangement 826.

The calibration resistor 804 can be any resistive element. The calibration resistor 804 can have a specified resistance, an unspecified reactance, or both. The specified resistance can be a specified, measured, or calibrated value. For example, the specified resistance can be a nominal resistance value (e.g., a 100 ohm resistor), and can include a specified accuracy (e.g., plus or minus 0.1 percent). The specified resistance can be measured or calibrated, such as using a resistance measurement device (e.g., an ohmmeter) of a specified accuracy (e.g., an instrumentation grade device). The unspecified reactance can be due to one or more parasitic effects of the calibration resistor 804. For example, the unspecified reactance can be due to the configuration of the calibration resistor 804 (e.g., capacitance of resistive material, inductance of leads, capacitance of leads), and not due to an intentional configuration to include reactance.

The reactive element 806 can be any reactive element. The reactive element 806 can have a specified reactance, an unspecified resistance, or both. The reactive element 806 can include one or more of an inductor (e.g., as shown in FIG. 8), a capacitor, or any other element including a reactive component (e.g., an AC voltage across the component is out of phase with an AC current through the component). The specified reactance can be a specified, measured, or calibrated value. For example, the specified reactance can be a nominal reactance value (e.g., a 27 nanohenry inductor), and can include a specified accuracy (e.g., plus or minus 0.1 percent). The specified reactance can be measured or calibrated, such as using a reactance measurement device (e.g., a multimeter) of a specified accuracy (e.g., an instrumentation grade device). The unspecified resistance can be due to one or more parasitic effects of the reactive element 806. For example, the unspecified resistance can be due to the configuration of the reactive element 806 (e.g., resistance of inductive coils, resistance of leads), and not due to an intentional configuration to include resistance.

The short circuit component 816 can be any component, such as a component configured to reduce or otherwise tailor a resistance or reactance between two terminals (e.g., a shorted connection, such as a wire or busbar). The short circuit component 816 can have a specified resistance and a specified reactance. The specified resistance, the specified reactance, or both, can have a specified, measured, or calibrated value. In an example, one or more of the specified reactance or specified resistance can be assumed to be zero. For example, the resistance of the short circuit component 816 can be small enough to be negligible, such as below a detectable resistance of the calibration board 802.

The fourth circuit element 818 can be configured similarly to one or more of the calibration resistor 804 or the reactive element 806. For example, the fourth circuit element 818 can be a calibration resistor or a reactive element. In the example of FIG. 8, the fourth circuit element 818 is a calibration resistor, such as can have a specified resistance and an unspecified reactance. The specified resistance of the fourth circuit element 818 can match or approximately match the specified resistance of the calibration resistor 804, or can be configured to have a different value.

The current source 808 can be configured to provide a specified current through the reactive element 806, through the calibration resistor 804, and through the sense resistor arrangement 826 of the current measurement system 100. The current source 808 can include a current source resistor 820. The current source resistor 820 can be coupled to a reference voltage 822. The specified current can be generated according to the equation 2.

$$ \text{specified current} = VREF/RCURRENT \qquad \text{Equation 2} $$

In equation 2, VREF is the reference voltage 822 and RCURRENT is the resistance of the current source resistor 820. The current source resistor 820 can generate the specified current while the calibration system 800 is performing a calibration. The specified current can travel through the calibration loop 830 and the sense resistor arrangement 826. The current source 808 can generate an AC current at a specified frequency, a DC current, or both. The frequency can be selected to match an EIS measurement frequency.

During a calibration, the voltage measurement circuitry 810 can be configured to measure a first voltage across the calibration resistor 804 while the current source 808 provides a first current. The voltage measurement circuitry 810 can also be configured to measure a second voltage across the sense resistor arrangement 826 while the current source 808 provides the first current. The voltage measurement circuitry 810 can also be configured to measure a third voltage across the reactive element 806 while the current source provides a second current. The voltage measurement circuitry 810 can also be configured to measure a fourth voltage across the sense resistor arrangement while the current source provides the second current. In an example, the second current can match or approximately match the first current. In an example, the second current can differ from the first current. One or more of the first voltage, the second voltage, the third voltage, or the fourth voltage can be used to determine a calibrated resistance value, a calibrated reactance value, or both, associated with the sense resistor arrangement 826. For example, the processor can use the first voltage, the second voltage, the third voltage, and the fourth voltage to determine the calibrated resistance value and the calibrated reactance value according to equations 3-10.

$$ Z_{804} = R_{specified} + jQ_{unspecified} \qquad \text{Equation 3} $$

$$ Z_{826} = \frac{V_{second}}{V_{first}} z_{804} \qquad \text{Equation 4} $$

$$ \frac{V_{second}}{V_{first}} = a_1 + jb_1 \qquad \text{Equation 5} $$

$$ Z_{826} = (a_1 + jb_1)(R_{specified} + jQ_{unspecified}) \qquad \text{Equation 6} $$

$$ Z_{806} = R_{unspecified} + jQ_{specified} \qquad \text{Equation 7} $$

$$ Z_{826} = \frac{V_{fourth}}{V_{third}} z_{806} \qquad \text{Equation 8} $$

$$ \frac{V_{fourth}}{V_{third}} = a_2 + jb_2 \qquad \text{Equation 9} $$

$$ Z_{826} = (a_2 + jb_2)(R_{unspecified} + jQ_{specified}) \qquad \text{Equation 10} $$

Equations 3-6 can correspond to the measurements taken while the current source 808 is generating the first current and equations 7-10 can correspond to measurements taken while the current source 808 is generating the second current. Z_804 is the complex impedance of the calibration resistor 804, R_specified is the specified resistance, Q_unspecified is the unspecified reactance. V_first is the first voltage, V_second is the second voltage. The complex ratio of the second voltage to the first voltage is a_1+j*b_1. Z_826 is the complex impedance of the sense resistor arrangement 826, including the calibrated resistance value and the calibrated reactance value. Z_806 is the complex impedance of the reactive element 806, R_unspecified is the unspecified resistance and Q_specified is the specified reactance. V_third is the third voltage and V_fourth is the fourth voltage. The complex ratio of the fourth voltage to the third voltage is a_2+j*b_2.

Equation 4 shows that because the current through the sense resistor arrangement 826 and the calibration resistor 804 during the measuring of the first voltage and the second voltage are equal (e.g., the first current), the ratio of complex impedances are equivalent to the ratio of complex voltages. Equation 8 shows a similar relationship for the sense resistor arrangement 826 and the reactive element 806 when the second current is passing through the sense resistor arrangement 826 and the reactive element 806.

Equation 6 contains one unspecified variable in the form of the unspecified reactance. Equation 10 contains one unspecified variable in the form of the unspecified resistance. Equations 6 and 10 can be equated to each other and solved (e.g., solved as a system of linear equations) as two equations with two unspecified variables. Using the solved variable values in either equation 6 or 10 can provide the complex impedance of the sense resistor arrangement 826, as shown in equation 11.

$$ Z_{826} = R_{calibrated} + jQ_{calibrated} \qquad \text{Equation 11} $$

R_calibrated is the calibrated resistance value and Q_calibrated is the calibrated reactance value. The calibrated resistance value, the calibrated reactance value, or both, can be stored, such as stored in a memory of the current measurement system 100. One or more of the calibrated resistance value or the calibrated reactance value can be used to make an EIS measurement, such as when the calibration board 802 is uncoupled from the current measurement system 100 and a cell arrangement is coupled between the cell arrangement connection terminals 828.

In an example, the multiplexer 814 can be configured to connect the ADC 812 to the short circuit component 816, such as to determine a zero-voltage offset of the ADC. For example, the multiplexer 814 can couple the ADC 812 across the short circuit component 816, such as when there is the first current, the second current, or a different current flowing through the short circuit component 816. The ADC 812 can measure the voltage across the short circuit component 816, and can make an adjustment or correction to move the measured voltage towards zero (e.g., the voltage across an ideal short circuit component). For example, the ADC 812 can internally set (e.g., zero, calibrate) the zero voltage offset. In an example, the processor 824 can record a digital representation of the zero voltage offset, and subtract this representation from the output of the ADC 812 before using the output values.

In an example, the voltage measurement circuitry 810 can measure a fifth voltage across the fourth circuit element while the current source 808 provides a third current. The voltage measurement circuitry 810 can also measure a sixth voltage across the sense resistor arrangement while the current source 808 provides the third current. The fifth voltage, the sixth voltage, or both, can be used to verify the determined calibrated resistance value and the determined calibrated reactance value, such as using operations similar to those shown in equations 3-6.

In an example, the reference voltage 822 connected across the current source resistor 820 can match or be related to the reference voltage 822 connected to the ADC 812. In an example, the reference voltage 822 connected to the ADC 812 can represent the root-mean-square (RMS) value of the reference voltage 822 connected across the current source resistor 820.

In an example, the current measurement system 100 can be installed in a location of use during the calibration (e.g., the current measurement system 100 can be installed before the calibration begins). This can allow the calibration to account for one or more parasitic effects of the location of use (e.g., the location of use can affect an effective reactance or resistance of the sense resistor arrangement 826).

In an example, the calibration resistor 804, the reactive element 806, and the current source 808 are included on the calibration board 802 separate from the current measurement system 100. For example, the calibration board 802 can be a temporary board installed during a startup or rebuild of a system (e.g., an electrolyzer system), or can be used recurrently to recalibrate a system, but may not be installed when not in use for calibration. The calibration board 802 can be used, such as at different times, to calibrate multiple systems. In an example, the calibration system 800, the calibration board 802, or both, include the current measurement system 100. In an example, the current measurement system 100 includes the calibration board 802, the calibration system 800, or both.

FIG. 9 shows an example of portions of a method 900 for operating a calibration system (e.g., the calibration system 800). The method 900 can be a method for calibrating an electrochemical impedance spectroscopy (EIS) current measurement system (e.g., the current measurement system 100). At step 902, a first voltage across a calibration resistor and a second voltage across a sense resistor arrangement can be measured. A first current through the calibration resistor can be equal to the first current through the sense resistor arrangement. The calibration resistor can have a specified resistance and an unspecified reactance. The sense resistor arrangement can have an unspecified resistance and an unspecified reactance.

At step 904, a third voltage across a reactive element and a fourth voltage across the sense resistor arrangement can be measured. A second current through the reactive element can be equal to the second current through the sense resistor arrangement. The reactive element can have a specified reactance and an unspecified resistance.

At step 906, a calibrated resistance and a calibrated reactance of the sense resistor arrangement can be calculated using the first voltage, the second voltage, the third voltage, and the fourth voltage. In an example, the calibrated resistance and calibrated reactance can be calculated as discussed above with respect to equations 3-10.

At step 908, a calibrated EIS measurement can be performed using the calibrated resistance and the calibrated reactance. For example, a SoC, a SoH, or another measurement of a cell arrangement can be made, such as discussed above. In an example, the EIS measurement can include providing an EIS excitation current through an electrochemical cell (e.g., the cell arrangement 102) and through the sense resistor arrangement. The EIS measurement can also include measuring a sense voltage across the sense resistor arrangement and, using the calibrated resistance and calibrated reactance, determining a current through the sense resistor arrangement and through the electrochemical cell. The EIS measurement can also include measuring a cell voltage across the electrochemical cell and, using the determined current, determining an impedance of the electrochemical cell. This determined impedance can be used, optionally along with one or more other factors (e.g., EIS frequency, DC component of the current) to determine an EIS parameter.

At step 910, a fifth voltage across a short circuit element can be measured. The measured fifth voltage can be used to determine an offset in an ADC used to measure one or more of the first voltage, the second voltage, the third voltage, the fourth voltage, or the fifth voltage (e.g., the ADC 812).

The calibration system 800, such as using the method 900, can be used to determine a calibrated resistance value, calibrated reactance value, or both, at more than one frequency. The determined calibrated resistance values and calibrated reactance values can be stored along with their corresponding frequency. For example, calibrated resistance values and calibrated reactance values could be determined across a range of frequencies, such as corresponding to a range of EIS measurement frequencies. Calibrated resistance values, calibrated reactance values, or both, corresponding to an EIS measurement frequency can be used during an EIS measurement. This can help to correct for or otherwise adjust for a varying complex impedance of the sense resistor arrangement 826 across one or more frequencies. In an example, the nearest corresponding calibration frequency can be used, or values can be interpolated between frequencies.

The shown order of steps is not intended to be a limitation on the order in which the steps are performed. In an example, two or more steps may be performed simultaneously or at least partially concurrently.

Gain Selection

The present inventors have recognized, among other things, that an impedance of a cell arrangement (e.g., an electrolysis cell) can vary across frequencies. For example, between a high frequency (e.g., 10 kilohertz) and low frequency (e.g., 100 hertz), there can be a five times to 10 times increase in impedance. In other examples, the variability can be even larger. One or more gain values in an EIS signal chain can be set to one or more of tailor a measurement range of an ADC (e.g., match a measured voltage to a percentage of the ADC measurement range), tailor a signal-to-noise ratio (SNR) (e.g., minimize or reduce a signal to noise ratio of an measurement, such as a voltage measurement), or tailor an excitation current to a specific percentage of a DC operating point of the cell arrangement (e.g., keep the EIS excitation current below five percent of the DC operating current, such as to keep the cell arrangement in a linear range of operation).

Figure 10:
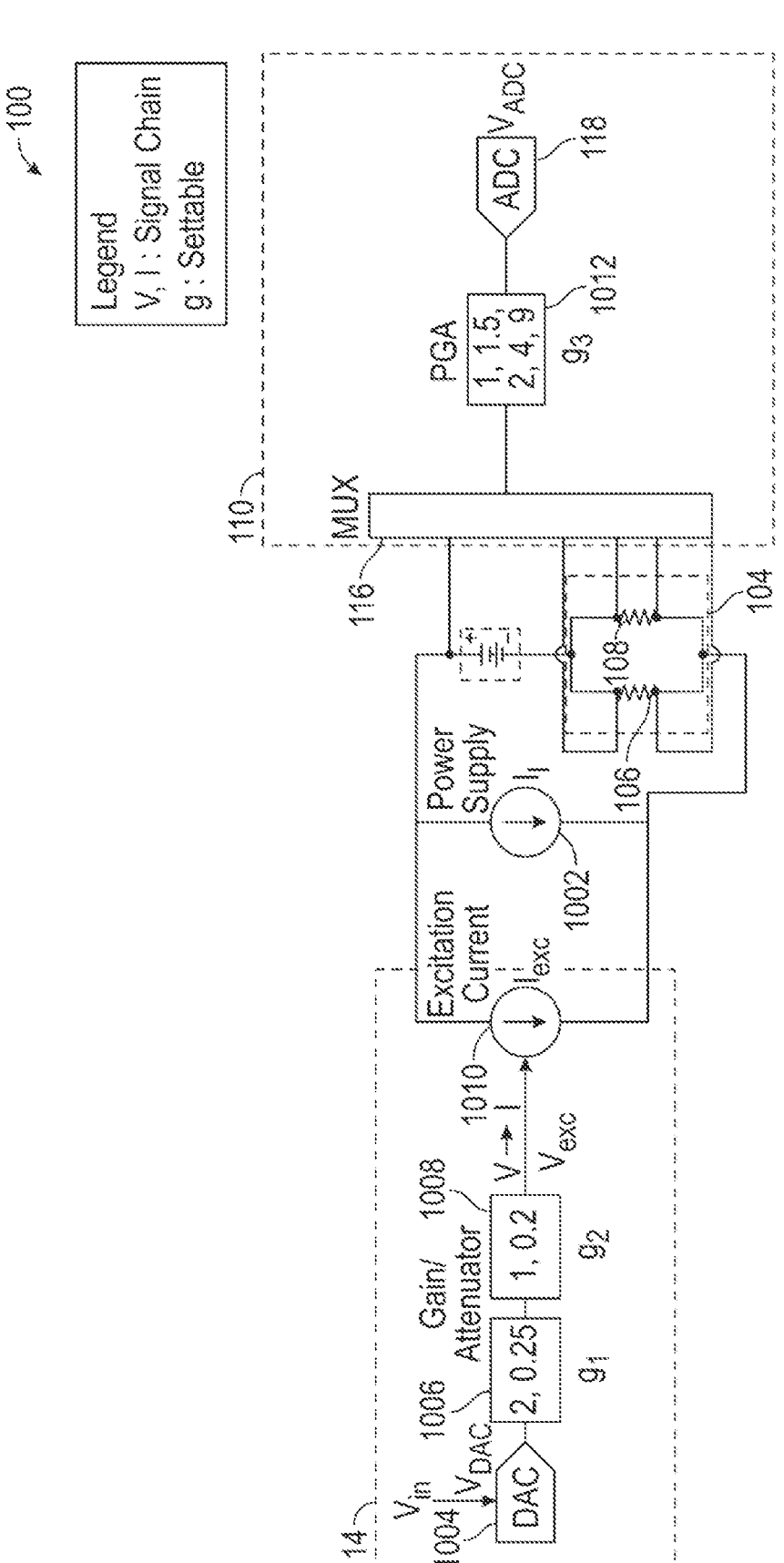
FIG. 10 is a schematic drawing an example of portions of a current measurement system including adjustable gain stages.

FIG. 10 shows an example of portions of a current measurement system 100 including adjustable gain stages. The current measurement system 100 of FIG. 10 can be configured similarly to the current measurement system 100 of FIG. 1 or FIG. 2, or can differ in one or more ways. In an example, the current measurement system 100 of FIG. 10 can be configured similarly to the current measurement system 600 of FIG. 6. FIG. 10 can also show portions of an electrolysis system, including a power supply 1002. The power supply 1002 can be configured to provide power to the cell arrangement 102 (e.g., an arrangement of one or more electrolysis cells), such as to drive a reaction in the cell arrangement 102 (e.g., generating hydrogen from water).

FIG. 10 shows that the test current source or sink 114 can include a digital-to-analog converter 1004, a first gain stage 1006, a second gain stage 1008, and an adjustable current source 1010. The digital-to-analog converter 1004 can receive a digital signal and generate a corresponding analog signal. The digital-to-analog converter 1004 can receive a signal from the processor circuitry 112, such as a signal to generate an AC output signal at a specified EIS frequency. The digital-to-analog converter 1004 can generate an output voltage (e.g., as shown in FIG. 10), an output current, or another form of analog output signal.

The signal from the digital-to-analog converter 1004 can pass through one or more gain stages before reaching the adjustable current source 1010, such as the first gain stage 1006 and the second gain stage 1008. The first gain stage 1006 and the second gain stage 1008 can amplify (e.g., increase) or attenuate (e.g., reduce) a signal level between their input and output. One or more of the first gain stage 1006 or the second gain stage 1008 can have a programmable gain level. The first gain stage 1006, the second gain stage 1008, or both, can have any range of gain levels, and can have discrete gain steps or a continuous gain control. For example, the first gain stage 1006 can be programmed (e.g., programmed by the processor circuitry 112) to have a gain of 2 or 0.25. The second gain stage 1008 can be programmed (e.g., programmed by the processor circuitry 112) to have a gain of 1 or 0.2. In an example, the input signal to the digital-to-analog converter 1004 also has an adjustable signal level, such as can be adjusted by the processor circuitry 112.

The adjustable current source 1010 can generate a current signal corresponding to the received analog signal. The generated current signal can have an amplitude corresponding to an amplitude of the received signal.

FIG. 10 shows that the voltage measurement circuitry 110 can include a multiplexer 116, a pre-gain amplifier 1012, and a voltage measurement device 118. In the example of FIG. 10, the voltage measurement device 118 is an analog-to-digital converter (ADC). The multiplexer 116 can be configured to selectably connect the cell arrangement 102, the first sense resistor 106, or the second sense resistor 108 to the voltage measurement device 118 (e.g., through the pre-gain amplifier 1012), as discussed above.

The pre-gain amplifier 1012 can be configured to amplify or attenuate a signal level of the signal output from the multiplexer 116 before the signal is input to the voltage measurement device 118. The pre-gain amplifier 1012 can have a programmable gain level. The pre-gain amplifier 1012 can have any range of gain levels, and can have discrete gain steps or a continuous gain control. For example, the pre-gain amplifier 1012 can be programmed (e.g., programmed by the processor circuitry 112) to have a gain of 1, 1.5, 2, 4, or 9.

The gain of one or more of the adjustable components (e.g., the input to the digital-to-analog converter 1004, the first gain stage 1006, the second gain stage 1008, the pre-gain amplifier 1012) can be selected, such as to one or more of maximize or otherwise tailor a signal-to-noise ratio of one or more measurements, avoid saturating or reduce saturation of the voltage measurement device 118, match the input signal to the voltage measurement device 118 to a specified percentage of the range of the voltage measurement device 118, or maintain the current from the adjustable current source 1010 below a specified threshold percentage of the current through the power supply 1002.

FIG. 11 shows an example of portions of a method 1100 for selecting one or more gain settings in a current measurement system 100. The method 1100 can be a method for selecting one or more gain values in an EIS current measurement system, such as to provide an improved signal-to-noise characteristic (e.g., an improved signal-to-noise ratio in one or more portions of the current measurement system, an improved measurement accuracy, a reduced uncertainty in a measurement value). The signal to noise ratio of an EIS measurement can be related to the ratio of the excitation current from the adjustable current source 1010 to the power supply current from the power supply 1002 (e.g., an electrolytic power supply). For example, a noise level in the current measurement system 100, such as due to the power supply 1002 (e.g., switching noise), can be generally consistent across a range of excitation current values. In this way, increasing the excitation current can reduce the signal to noise ratio by increasing the excitation signal level.

At step 1102, an excitation current gain can be selected such that an excitation current is a specified percentage of a power supply current. For example, the test current source or sink 114, including one or more of the signal input to the digital-to-analog converter 1004, the first gain stage 1006, or the second gain stage 1008, can be adjusted so that the excitation current is a specified percentage of the power supply current. For example, the excitation current can be configured to be three percent of the power supply current, five percent of the power supply current, or seven percent of the power supply current. Increasing the excitation current above the specified percentage can reduce an accuracy of an EIS measurement, such as due to the cell arrangement 102 operating outside of the linear range (e.g., the AC excitation signal begins affecting how the cell arrangement 102 interacts with the power supply current). If the test current source or sink 114 is not able to produce a signal as large as the specified percentage of the power supply current, the test current source or sink 114 can be set to produce a maximum configurable current (e.g., produce as close to the specified percentage as the test current source or sink 114 can).

An accuracy of the voltage measurement circuitry 110 can be increased or otherwise tailored by adjusting the pre-gain amplifier 1012 so that the voltage measurement device 118 is measuring across a specified percentage of the non-saturation range (e.g., full-scale range) of the voltage measurement device 118. At step 1104, a larger one of an electrochemical cell arrangement impedance indication value and a sense resistor arrangement impedance indication value can be selected. The selected impedance indication value can be used as a determined impedance indication value. The impedance indication values can represent the impedance of the electrochemical cell and the sense resistor arrangement (e.g., represent in units of impedance, such as ohms), or can be an indication or an impedance value (e.g., a unitless indication, such as an unscaled ADC output). For example, the impedance of the larger of the cell arrangement 102 or the parallel arrangement of a plurality of sense resistors 104 (e.g., the effective impedance) can be selected and used as the determined impedance indication value.

At step 1106, voltage measurement circuitry current gain can be selected such that the current measurement system will reach a specified amount of a non-saturation range of the current measurement system when measuring the determined impedance indication value. For example, an estimated current through the determined impedance indication value can be used to estimate the voltage across the larger of the cell arrangement 102 or the parallel arrangement of a plurality of sense resistors 104. The specified percentage of the non-saturation range can be one or more of 50 percent of the non-saturation range, 70 percent of the non-saturation range, or 80 percent of the non-saturation range. For example, the voltage measurement circuitry 110 can measure a voltage corresponding to the cell arrangement 102 in addition to one or more voltages corresponding to the parallel arrangement of a plurality of sense resistors 104 (e.g., the voltage across the first sense resistor 106 or the second sense resistor 108) during an EIS measurement. The gain settings of the current measurement system 100 can be held constant during an EIS measurement, such as to allow for an accurate calculation of the impedance of the cell arrangement 102. The gain of the pre-gain amplifier 1012 can be set based on the larger impedance value of the cell arrangement 102 or the parallel arrangement of a plurality of sense resistors 104 (e.g., such as determined at step 1104), such as to avoid saturation when measuring the larger impedance component.

The shown order of steps is not intended to be a limitation on the order in which the steps are performed. In an example, two or more steps may be performed simultaneously or at least partially concurrently.

FIG. 12 shows an example of portions of a method 1200 for selecting one or more gain settings in a current measurement system 100. The method 1200 can be a method for selecting one or more gain values in an EIS current measurement system, such as to provide an improved signal-to-noise characteristic (e.g., an improved signal-to-noise ratio in one or more portions of the current measurement system). The method 1200 can be performed with or as a portion of the method 1100. The method can be performed on a current measurement system, such as the current measurement system 100. At step 1202, a larger one of an electrochemical cell arrangement impedance indication value and a sense resistor arrangement impedance indication value can be selected. The selected impedance indication value can be used as a determined impedance indication value. The impedance indication values can represent the impedance of the electrochemical cell and the sense resistor arrangement (e.g., represent in units of impedance, such as ohms), or can be an indication of an impedance value (e.g., a unitless indication, such as an unscaled ADC output). For example, the impedance of the larger of the cell arrangement 102 or the parallel arrangement of a plurality of sense resistors 104 (e.g., the effective impedance) can be selected and used as the determined impedance indication value. In an example, the cell arrangement 102 impedance can be estimated based on a membrane area of an electrolytic cell. For example, the cell arrangement 102 impedance can be inversely related to membrane area.

At step 1204, for a plurality of gain setting combinations, an EIS excitation current value at which current measurement circuitry of the current measurement system will reach a specified amount of a non-saturation range of the current measurement system when measuring the determined impedance indication value can be determined. For example, various combinations of the gain settings of the current measurement system 100 can be determined that result in the voltage measurement device 118 reaching a specified amount of the non-saturation range.

At step 1206, for the plurality of gain setting combinations, a signal-to-noise characteristic at the determined EIS excitation current based upon a determined noise level in at least one part of the current measurement system can be determined. This can include determining the signal-to-noise characteristic in a simulated or theoretical setting, such as based on the ratio of the excitation current to the power supply current, or can be based upon experimentally collected data.

At step 1208, from the plurality of gain setting combinations, a combination that results in a largest estimated signal-to-noise ratio can be selected. For example, the gain setting combination with the largest signal-to-noise characteristic can correspond to the gain setting combination with the largest signal-to-noise ratio. In an example, the selected gain setting can be a setting that maximizes an excitation current without exceeding the specified percentage of the power supply current or saturating the voltage measurement device 118 when measuring the voltage across the larger of the cell arrangement 102 or the parallel arrangement of a plurality of sense resistors 104. For example, an initial set including a number of combinations of gain setting values, such as all possible combinations, can be generated. At step 1204, the effective gain of each combination can be determined, and the effective gains that are determined to generate a signal to the voltage measurement device 118 within a specified percentage of the non-saturation region can be selected, while removing the remaining combinations. Then, at step 1206, the signal-to-noise ratio for each selected combination can be determined, such as using a simulation of the current measurement system 100 including one or more noise sources (e.g., thermal noise, noise in the power supply 1002, noise in the adjustable current source 1010). At step 1208, the combination with the largest signal-to-noise ratio can be selected.

In an example, an EIS measurement can be performed with the one or more gain values corresponding to the selected combination programmed into the current measurement system, such as discussed above. In an example, the signal-to-noise characteristic can be based on a noise level of the test current source or sink 114, the voltage measurement circuitry 110, or both, alternatively or in addition to the power supply 1002.

At step 1210, a look-up-table can be generated including the gain setting combination that results in a largest signal-to-noise ratio for each of a plurality of electrochemical cell arrangement impedance indication values. For example, the look-up-table can be generated based on simulation data across a range of cell arrangement 102 impedance values. The selected combination for a given electrochemical cell arrangement impedance value can be selected, such as following the measurement of a cell arrangement coupled to the current measurement system 100. For example, upon startup or initialization, the current measurement system 100 can measure the impedance of the cell arrangement 102, and select the gain values corresponding to the gains returned from the look-up-table.

In an example, one or more steps of the method 1200 can be performed for two or more frequencies, for two or more cell arrangement impedance values, or combinations thereof. For example, the steps of the method 1200 can be performed across a range of EIS measurement frequencies. The resulting combinations that maximize the signal-to-noise ratio can be stored in a look-up-table that can be queried by frequency, cell arrangement impedance, or both.

In an example, the method 1200 can include conducting an EIS current measurement sweep over at least two frequencies, such as using the gain settings selected at step 1208. In response to the current measurement circuitry saturating (e.g., the voltage measurement device 118 saturating), a gain setting combination can be selected with a reduced overall gain for the frequency at which the current measurement circuitry saturated. The EIS current measurement for the frequency at which the current measurement circuitry saturated can be re-conducted, or the entire EIS measurement sweep can be re-conducted.

The shown order of steps is not intended to be a limitation on the order in which the steps are performed. In an example, two or more steps may be performed simultaneously or at least partially concurrently.

Figure 13:
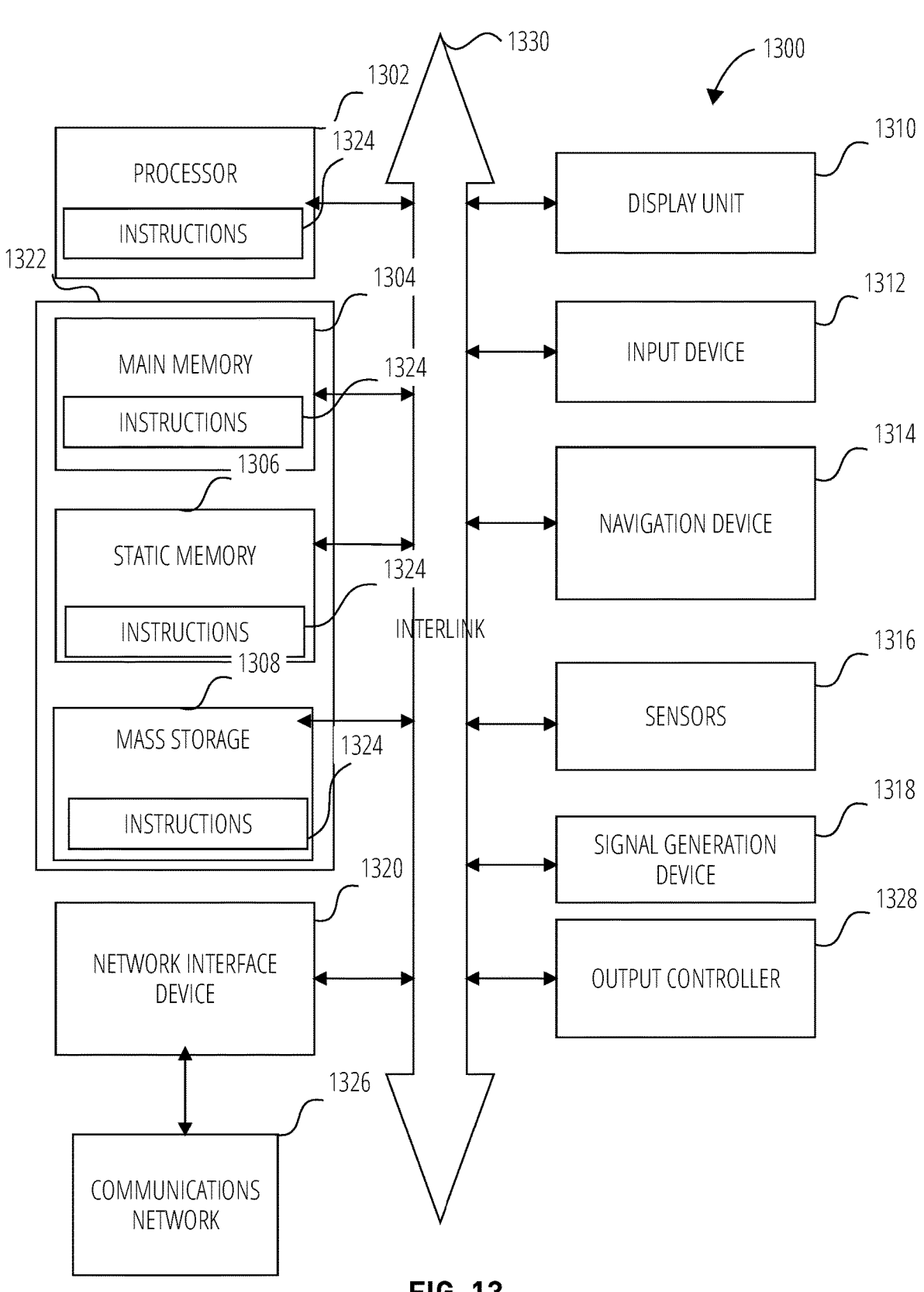
FIG. 13 is a block diagram illustrating an example of a machine upon which one or more examples may be implemented.

FIG. 13 illustrates a block diagram of an example machine 1300 upon which any one or more of the techniques (e.g., methodologies) discussed herein may be implemented. Examples, as described herein, may include, or may operate by, logic or a number of components, or mechanisms in the machine 1300. Circuitry (e.g., processing circuitry) is a collection of circuits implemented in tangible entities of the machine 1300 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1300 follow.

In alternative examples, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in peer-to-peer (P2P) (or other distributed) network environment. The machine 1300 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (Saas), other computer cluster configurations.

The machine 1300 may include a hardware processor 1302 (e.g., a central processing unit (CPU), a graphics processing unit (GPU), a hardware processor core, or any combination thereof), a main memory 1304, a static memory (e.g., memory or storage for firmware, microcode, a basic-input-output (BIOS), and mass storage 1308 (e.g., hard drives, tape drives, flash storage, or other block devices) some or all of which may communicate with each other via an interlink 1330 (e.g., bus). The machine 1300 may further include a display unit 1310, an alphanumeric input device 1312 (e.g., a keyboard), and a user interface (UI) navigation device 1314 (e.g., a mouse). In an example, the display unit 1310, input device 1312 and UI navigation device 1314 may be a touch screen display. The machine 1300 may additionally include a signal generation device 1318 (e.g., a speaker), a network interface device 1320, and one or more sensors 1316, such as a global positioning system (GPS) sensor, compass, accelerometer, or other sensor. The machine 1300 may include an output controller 1328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1302, the main memory 1304, the static memory 1306, or the mass storage 1308 may be, or include, a machine readable medium 1322 on which is stored one or more sets of data structures or instructions 1324 (e.g., software) embodying or utilized by any one or more of the techniques or functions described herein. The instructions 1324 may also reside, completely or at least partially, within any of registers of the processor 1302, the main memory 1304, the static memory 1306, or the mass storage 1308 during execution thereof by the machine 1300. In an example, one or any combination of the hardware processor 1302, the main memory 1304, the static memory 1306, or the mass storage 1308 may constitute the machine readable media 1322. While the machine readable medium 1322 is illustrated as a single medium, the term "machine readable medium" may include a single medium or multiple media (e.g., a centralized or distributed database, and/or associated caches and servers) configured to store the one or more instructions 1324.

The term "machine readable medium" may include any medium that is capable of storing, encoding, or carrying instructions for execution by the machine 1300 and that cause the machine 1300 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1322 may be representative of the instructions 1324, such as instructions 1324 themselves or a format from which the instructions 1324 may be derived. This format from which the instructions 1324 may be derived may include source code, encoded instructions (e.g., in compressed or encrypted form), packaged instructions (e.g., split into multiple packages), or the like. The information representative of the instructions 1324 in the machine readable medium 1322 may be processed by processing circuitry into the instructions to implement any of the operations discussed herein. For example, deriving the instructions 1324 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1324.

In an example, the derivation of the instructions 1324 may include assembly, compilation, or interpretation of the information (e.g., by the processing circuitry) to create the instructions 1324 from some intermediate or preprocessed format provided by the machine readable medium 1322. The information, when provided in multiple parts, may be combined, unpacked, and modified to create the instructions 1324. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1324 may be further transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1320 may include one or more physical jacks (e.g., Ethernet, coaxial, or phone jacks) or one or more antennas to connect to the communications network 1326. In an example, the network interface device 1320 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1300, and includes digital or analog communications signals or other intangible medium to facilitate communication of such software. A transmission medium is a machine-readable medium.

The following, non-limiting examples, detail certain aspects of the present subject matter to solve the challenges and provide the benefits discussed herein, among others.

EXAMPLES

Example 1 is an electrochemical impedance spectroscopy (EIS) current measurement system for measuring a current through a cell arrangement including one or more electrochemical cells, the current measurement system comprising: a parallel arrangement of a plurality of sense resistors, configured to be placed in series with the cell arrangement; and voltage measurement circuitry, configured to measure respective voltages across corresponding ones of the sense resistors.

In Example 2, the subject matter of Example 1 optionally includes processor circuitry, coupled to the voltage measurement circuitry, configured to calculate at least one of an alternating current (AC) or direct current (DC) current through the cell arrangement.

In Example 3, the subject matter of Example 2 optionally includes a test current source or sink, configured to provide a test current to the cell arrangement and to the parallel arrangement of the sense resistors.

In Example 4, the subject matter of any one or more of Examples 2-3 optionally include wherein the processor circuitry is configured to calculate the current through the cell arrangement by calculating respective currents through corresponding ones of the sense resistors and summing the respective currents.

In Example 5, the subject matter of any one or more of Examples 2-4 optionally include wherein the processor circuitry is configured to measure an AC current through the cell arrangement across a range of frequencies.

In Example 6, the subject matter of any one or more of Examples 2-5 optionally include wherein the voltage measurement circuitry comprises a multiplexer, coupled to respective individual ones of the sense resistors, the multiplexer configured to couple a selected individual one of the sense resistors to a voltage measurement device.

In Example 7, the subject matter of any one or more of Examples 2-6 optionally include wherein the voltage measurement circuitry comprises a plurality of voltage measurement devices, respectively coupled to corresponding individual ones of the sense resistors.

In Example 8, the subject matter of any one or more of Examples 1-7 optionally include wherein the cell arrangement includes at least one of a battery cell, a fuel cell, an electrolysis cell, or other electrochemical cell.

In Example 9, the subject matter of any one or more of Examples 1-8 optionally include wherein the cell arrangement includes at least one of a series arrangement or parallel arrangement of at least two electrochemical cells.

In Example 10, the subject matter of any one or more of Examples 1-9 optionally include wherein the cell arrangement includes a combination of series and parallel arrangements of at least four electrochemical cells.

In Example 11, the subject matter of any one or more of Examples 1-10 optionally include watts of power.

In Example 12, the subject matter of any one or more of Examples 1-11 optionally include amperes.

In Example 13, the subject matter of any one or more of Examples 1-12 optionally include wherein a combined parallel resistance value of the sense resistors is approximately equal to a resistance value of the cell arrangement.

Example 14 is a method for measuring a current through a cell arrangement including one or more electrochemical cells, the method comprising: measuring respective voltages corresponding to respective ones of a plurality of sense resistors, the sense resistors in a parallel arrangement, the parallel arrangement in series with the cell arrangement; calculating respective current values corresponding to respective ones of the plurality of sense resistors using the measured respective voltages and specified resistances of the respective ones of the plurality of sense resistors; and summing the calculated respective current values to determine the current through the cell arrangement.

In Example 15, the subject matter of Example 14 optionally includes wherein the measuring respective voltages includes measuring at least two voltages at least partially concurrently.

In Example 16, the subject matter of any one or more of Examples 14-15 optionally include wherein the measuring respective voltages includes measuring at least two voltages using a shared voltage measurement device.

In Example 17, the subject matter of Example 16 optionally includes wherein the shared voltage measurement device includes a single voltage measurement device to measure a voltage corresponding to each of the plurality of sense resistors before the summing of the calculated respective current values.

In Example 18, the subject matter of any one or more of Examples 14-17 optionally include recurrently determining the current through the cell arrangement at a specified interval.

In Example 19, the subject matter of any one or more of Examples 14-18 optionally include using the determined current through the cell arrangement in an electrochemical impedance spectroscopy (EIS) system.

Example 20 is an electrochemical impedance spectroscopy (EIS) current measurement system for measuring a current through a cell arrangement including one or more electrochemical cells, the current measurement system comprising: a parallel arrangement of a plurality of sense resistors, configured to be placed in series with the cell arrangement; voltage measurement circuitry, configured to measure respective voltages across corresponding ones of the sense resistors; and a test current source or sink, configured to provide a test current to the cell arrangement and to the parallel arrangement of the sense resistors.

Example 21 is an electrochemical impedance spectroscopy (EIS) current measurement system for measuring a current through a cell arrangement including one or more electrochemical cells, the current measurement system comprising: a sense resistor arrangement, configured to be placed in series with the cell arrangement; and voltage measurement circuitry, configured to measure a voltage across the sense resistor arrangement, including to measure at least a direct current (DC) component of the voltage, wherein a current through the sense resistor arrangement has a DC component and an alternating current (AC) component.

In Example 22, the subject matter of Example 21 optionally includes wherein the sense resistor arrangement includes a plurality of sense resistors in a parallel arrangement, wherein the voltage measurement circuitry is configured to measure respective voltages across corresponding ones of the sense resistors.

In Example 23, the subject matter of any one or more of Examples 21-22 optionally include wherein the voltage measurement circuitry is configured to measure an AC component of the voltage.

In Example 24, the subject matter of any one or more of Examples 21-23 optionally include a second sense resistor arrangement, configured to be placed in series with the cell arrangement; and second voltage measurement circuitry, configured to measure a second voltage across the second sense resistor arrangement, including to measure at least an AC component of the second voltage.

In Example 25, the subject matter of any one or more of Examples 21-24 optionally include processor circuitry, coupled to the voltage measurement circuitry, configured to calculate at least a DC component of a current through the cell arrangement.

In Example 26, the subject matter of Example 25 optionally includes a test current source or sink, configured to provide a test current to the cell arrangement and to the sense resistor arrangement.

In Example 27, the subject matter of any one or more of Examples 21-26 optionally include a disconnect switch, the switch configured to open when the measured DC component of the current exceeds a specified threshold.

Example 28 is a method of making an electrochemical impedance spectroscopy (EIS) measurement for a cell arrangement including one or more electrochemical cells, the method comprising: determining a current through the cell arrangement, including determining at least a direct current (DC) component of the current, wherein the current has a DC component and an alternating current (AC) component; and determining at least one EIS property of the cell arrangement, including using the determined DC component of the current.

In Example 29, the subject matter of Example 28 optionally includes wherein the determining the current through the cell arrangement includes: measuring a voltage across a sense resistor arrangement, the sense resistor arrangement in series with the cell arrangement; and calculating a current through the sense resistor arrangement, including calculating at least a DC component of the current, wherein the current has a DC component and an AC component.

In Example 30, the subject matter of Example 29 optionally includes wherein the measuring the voltage across the sense resistor arrangement includes measuring respective voltages corresponding to respective ones of a plurality of sense resistors in a parallel arrangement comprising the sense resistor arrangement; and wherein the calculating the current through the sense resistor arrangement includes calculating respective current values corresponding to respective ones of the plurality of sense resistors using the measured respective voltages and specified resistances of the respective ones of the plurality of sense resistors, and summing the calculated respective current values to determine the current through the cell arrangement.

In Example 31, the subject matter of any one or more of Examples 29-30 optionally include measuring a second voltage across a second sense resistor arrangement, the second sense resistor arrangement in series with the cell arrangement; and calculating a second current through the second sense resistor arrangement, including calculating at least an AC component of the current.

In Example 32, the subject matter of Example 31 optionally includes wherein the measuring the voltage across the sense resistor arrangement includes using first voltage measurement circuitry and the measuring the second voltage across the second sense resistor arrangement includes using second voltage measurement circuitry.

In Example 33, the subject matter of Example 32 optionally includes wherein the measuring the voltage across the sense resistor arrangement and the measuring the second voltage across the second sense resistor arrangement occur at least partially concurrently.

In Example 34, the subject matter of any one or more of Examples 28-33 optionally include recording the DC component of the current; and associating the recorded current with the determined EIS property.

In Example 35, the subject matter of any one or more of Examples 28-34 optionally include wherein the determining the current through the cell arrangement includes determining the AC component in addition to the DC component.

In Example 36, the subject matter of Example 35 optionally includes wherein the determining the DC component and the determining the AC component occur at least partially concurrently.

In Example 37, the subject matter of any one or more of Examples 28-36 optionally include using the determined DC component to compensate for a non-ideality of at least one component of an electrochemical impedance spectroscopy (EIS) current measurement system.

In Example 38, the subject matter of Example 37 optionally includes using the measured DC component to compensate for an inductance of a sense resistor arrangement.

In Example 39, the subject matter of Example 38 optionally includes wherein an inductance of the sense resistor arrangement varies based upon the DC current through the sense resistor arrangement.

Example 40 is an electrochemical impedance spectroscopy (EIS) current measurement system for measuring a current through a cell arrangement including one or more electrochemical cells, the current measurement system comprising: a sense resistor arrangement, configured to be placed in series with the cell arrangement; voltage measurement circuitry, configured to measure a voltage across the sense resistor arrangement, including to measure at least a direct current (DC) component of the voltage, wherein a current through the sense resistor arrangement has a DC component and an alternating current (AC) component; and processor circuitry, configured to determine the DC component of current through the cell arrangement using the measured voltage across the sense resistor arrangement and a specified resistance value of the sense resistor arrangement, and configured to determine at least one EIS property of the cell arrangement using the determined DC component.

Example 41 is a calibration system for calibrating an electrochemical impedance spectroscopy (EIS) current measurement system, the calibration system comprising: a calibration resistor, having a specified resistance and an unspecified reactance; a reactive element having a specified reactance and an unspecified resistance; a current source, configured to provide a specified current through the reactive element, through the calibration resistor, and through a sense resistor arrangement of the EIS current measurement system to be calibrated, wherein the sense resistor arrangement has a resistance and a reactance; and voltage measurement circuitry, configured to measure (1) a first voltage across the calibration resistor and a second voltage across the sense resistor arrangement while the current source provides a first current and (2) a third voltage across the reactive element and a fourth voltage across the sense resistor arrangement while the current source provides a second current, wherein the first voltage, the second voltage, the third voltage, and the fourth voltage are used to determine a calibrated resistance value and a calibrated reactance value associated with the sense resistor arrangement.

In Example 42, the subject matter of Example 41 optionally includes wherein the voltage measurement circuitry includes: an analog-to-digital converter (ADC); and a multiplexer, configured to selectably connect the calibration resistor, reactive element, or sense resistor arrangement to the ADC.

In Example 43, the subject matter of Example 42 optionally includes a short circuit component, having a specified resistance and reactance, wherein the multiplexer is configured to connect the ADC to the short circuit component to determine a zero-voltage offset of the ADC.

In Example 44, the subject matter of any one or more of Examples 41-43 optionally include a fourth circuit element, having at least one of a specified resistance or a specified reactance, configured to receive the specified current, wherein the voltage measurement circuitry is configured to measure a fifth voltage across the fourth circuit element and a sixth voltage across the sense resistor arrangement while the current source provides a third current, wherein the fifth voltage and the sixth voltage are used to verify the determined calibrated resistance value and the determined calibrated reactance value.

In Example 45, the subject matter of any one or more of Examples 41-44 optionally include wherein the first current is equal to the second current.

In Example 46, the subject matter of any one or more of Examples 41-45 optionally include wherein the current source includes a specified voltage connected across a specified resistance, wherein the specified voltage is an ADC reference voltage.

In Example 47, the subject matter of any one or more of Examples 41-46 optionally include wherein the EIS current measurement system is installed in a location of use during the calibration, wherein the calibration is used to account for one or more parasitic effects of the location of use.

In Example 48, the subject matter of any one or more of Examples 41-47 optionally include the EIS current measurement system.

In Example 49, the subject matter of Example 48 optionally includes wherein the EIS current measurement system includes the voltage measurement circuitry.

In Example 50, the subject matter of Example 49 optionally includes wherein the calibration resistor, the reactive element, and the current source are included on calibration board separate from the EIS current measurement system.

In Example 51, the subject matter of any one or more of Examples 49-50 optionally include wherein at least one of the calibration resistor or the reactive element are connected in place of an electrochemical cell arrangement.

In Example 52, the subject matter of any one or more of Examples 49-51 optionally include wherein the reactive element includes at least one of a capacitor or an inductor.

Example 53 is a method for calibrating an electrochemical impedance spectroscopy (EIS) current measurement system, the method comprising: measuring a first voltage across a calibration resistor and a second voltage across a sense resistor arrangement, wherein a first current through the calibration resistor is equal to the first current through the sense resistor arrangement, wherein the calibration resistor has a specified resistance and an unspecified reactance and wherein the sense resistor arrangement has an unspecified resistance and an unspecified reactance; measuring a third voltage across a reactive element and a fourth voltage across the sense resistor arrangement, wherein a second current through the reactive element is equal to the second current through the sense resistor arrangement, wherein the reactive element has a specified reactance and an unspecified resistance; and calculating, using the first voltage, the second voltage, the third voltage, and the fourth voltage, a calibrated resistance value and a calibrated reactance value of the sense resistor arrangement.

In Example 54, the subject matter of Example 53 optionally includes performing a calibrated EIS measurement using the calibrated resistance value and the calibrated reactance value.

In Example 55, the subject matter of Example 54 optionally includes wherein the performing a calibrated EIS measurement includes: providing an EIS excitation current through an electrochemical cell and through the sense resistor arrangement; measuring a sense voltage across the sense resistor arrangement and, using the calibrated resistance value and the calibrated reactance value, determining a current through the sense resistor arrangement and through the electrochemical cell; and measuring a cell voltage across the electrochemical cell and, using the determined current, determining an impedance of the electrochemical cell.

In Example 56, the subject matter of Example 55 optionally includes wherein the first current and the second current are provided by a current source that is generated by applying a reference voltage to a resistance.

In Example 57, the subject matter of Example 56 optionally includes wherein the reference voltage is also used as an ADC reference voltage for an ADC used to measure the first voltage, the second voltage, the third voltage, and the fourth voltage.

In Example 58, the subject matter of Example 57 optionally includes measuring a fifth voltage across a short circuit element and using the measured fifth voltage to determine an offset in the ADC.

In Example 59, the subject matter of any one or more of Examples 53-58 optionally include determining at least one of the calibrated resistance value or the calibrated reactance value at more than one frequency.

Example 60 is a calibration system for calibrating an electrochemical impedance spectroscopy (EIS) current measurement system, the calibration system comprising: a calibration resistor, having a specified resistance and an unspecified reactance; a reactive element having a specified reactance and an unspecified resistance; a current source, configured to provide a specified current through the reactive element, through the calibration resistor, and through a sense resistor arrangement of the EIS current measurement system to be calibrated, wherein the sense resistor arrangement has a resistance and a reactance; and voltage measurement circuitry, configured to measure (1) a first voltage across the calibration resistor and a second voltage across the sense resistor arrangement while the current source provides a first current and (2) a third voltage across the reactive element and a fourth voltage across the sense resistor arrangement while the current source provides a second current, wherein the first voltage, the second voltage, the third voltage, and the fourth voltage are used to determine a calibrated resistance value and a calibrated reactance value associated with the sense resistor arrangement, wherein the calibrated resistance value and the calibrated reactance value are determined at more than one frequency.

Example 61 is a method for selecting one or more gain values in an electrochemical impedance spectroscopy (EIS) current measurement system to provide an improved signal-to-noise characteristic, the method comprising: selecting a larger one of an electrochemical cell arrangement impedance indication value and a sense resistor arrangement impedance indication value and using the selected impedance indication value as a determined impedance indication value; determining, for a plurality of gain setting combinations, an EIS excitation current value at which current measurement circuitry of the current measurement system will reach a specified amount of a non-saturation range of the current measurement system when measuring the determined impedance indication value; and determining, for the plurality of gain setting combinations, a signal-to-noise characteristic at the determined EIS excitation current based upon a determined noise level in at least one part of the EIS current measurement system.

In Example 62, the subject matter of Example 61 optionally includes selecting, from the plurality of gain setting combinations, a combination that results in a largest estimated signal-to-noise ratio.

In Example 63, the subject matter of Example 62 optionally includes performing an EIS measurement with the one or more gain values corresponding to the selected combination programmed into the EIS current measurement system.

In Example 64, the subject matter of any one or more of Examples 62-63 optionally include selecting the determined EIS excitation current corresponding to the selected combination.

In Example 65, the subject matter of any one or more of Examples 61-64 optionally include wherein the electrochemical cell arrangement impedance value is estimated based on a membrane area of an electrolytic cell.

In Example 66, the subject matter of any one or more of Examples 61-65 optionally include percent.

In Example 67, the subject matter of any one or more of Examples 61-66 optionally include wherein the plurality of gain setting combinations include a range of gain values for a pre-gain amplifier of the current measurement circuitry.

In Example 68, the subject matter of any one or more of Examples 61-67 optionally include determining the EIS excitation current value based on an input voltage value and at least one gain stage, wherein gain values for the at least one gain stage are included in the plurality of gain setting combinations.

In Example 69, the subject matter of any one or more of Examples 61-68 optionally include wherein the determined noise level in at least one part of the EIS current measurement system includes a determined noise level in an electrolytic power supply.

In Example 70, the subject matter of Example 69 optionally includes wherein the determined noise level in at least one part of the EIS current measurement system includes a determined noise level in an EIS current power supply and a noise level in the current measurement circuitry.

In Example 71, the subject matter of any one or more of Examples 61-70 optionally include generating a look-up-table including the gain setting combination that results in a largest signal-to-noise ratio for each of a plurality of electrochemical cell arrangement impedance indication values.

In Example 72, the subject matter of Example 71 optionally includes selecting, from the look-up-table, the combination corresponding to a cell arrangement impedance value; and selecting the gain settings corresponding to the selected combination.

In Example 73, the subject matter of any one or more of Examples 61-72 optionally include wherein the determining an EIS excitation current value at which current measurement circuitry of the EIS current measurement system will reach the specified amount of non-saturation range includes using a DC current in the EIS current measurement system.

In Example 74, the subject matter of any one or more of Examples 61-73 optionally include wherein the determining the larger one of the electrochemical cell arrangement impedance indication value and the sense resistor arrangement impedance indication value includes measuring the impedance of at least one of the cell arrangement or the sense resistor arrangement using the EIS current measurement system.

In Example 75, the subject matter of any one or more of Examples 61-74 optionally include selecting a gain combination; conducting an EIS current measurement sweep over at least two frequencies; in response to the current measurement circuitry saturating, selecting a gain setting combination with a reduced overall gain for the frequency at which the current measurement circuitry saturated; and re-conducting the EIS current measurement for the frequency at which the current measurement circuitry saturated.

In Example 76, the subject matter of Example 75 optionally includes in response to the current measurement circuitry saturating, selecting a gain setting combination with a reduced overall gain for the at least two frequencies; and re-conducting the EIS current measurement sweep over the at least two frequencies.

In Example 77, the subject matter of any one or more of Examples 61-76 optionally include selecting a gain combination; conducting an EIS current measurement sweep over at least two frequencies; in response to the current measurement circuitry not saturating, selecting a gain setting combination with an increased overall gain for the frequency at which the current measurement circuitry saturated; and re-conducting the EIS current measurement for the frequency at which the current measurement circuitry saturated.

Example 78 is a method for selecting one or more gain values in an electrochemical impedance spectroscopy (EIS) current measurement system to provide an improved signal-to-noise characteristic, the method comprising: selecting an excitation current gain such that an excitation current is a specified percentage of a power supply current; selecting a larger one of an electrochemical cell arrangement impedance indication value and a sense resistor arrangement impedance indication value and using the selected impedance indication value as a determined impedance indication value; and selecting a voltage measurement circuitry current gain such that the current measurement system will reach a specified amount of a non-saturation range of the current measurement system when measuring the determined impedance indication value.

In Example 79, the subject matter of Example 78 optionally includes performing an EIS measurement with the one or more gain values corresponding to the selected excitation current gain and the selected voltage measurement circuitry current gain programmed into the EIS current measurement system.

In Example 80, the subject matter of any one or more of Examples 78-79 optionally include selecting a gain combination; conducting an EIS current measurement sweep over at least two frequencies; in response to the current measurement system saturating, selecting a gain setting combination with a reduced overall gain for the frequency at which the current measurement circuitry saturated; and re-conducting the EIS current measurement for the frequency at which the current measurement circuitry saturated.

Example 81 is at least one machine-readable medium including instructions that, when executed by processing circuitry, cause the processing circuitry to perform operations to implement of any of Examples 1-80.

Example 82 is an apparatus comprising means to implement of any of Examples 1-80.

Example 83 is a system to implement of any of Examples 1-80.

Example 84 is a method to implement of any of Examples 1-80.

In example 85, any one or more of the above examples optionally includes wherein the cell arrangement is an electrolysis cell arrangement.

In example 86, any one or more of the above examples optionally includes wherein one or more (e.g., all) of the sense resistor arrangements include a single sense resistor.

Example 87 is any combination or permutation of one or more of the above examples.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific examples that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the terms "or" and "and/or" are used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5). Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the examples should be determined with reference to the appended claims, along with the full scope of equivalents to which such claims are entitled.

What is claimed is:

1. A method for selecting one or more gain values in an electrochemical impedance spectroscopy (EIS) current measurement system to provide an improved signal-to-noise characteristic, the method comprising:
   selecting a larger one of an electrochemical cell arrangement impedance indication value and a sense resistor arrangement impedance indication value and using the selected impedance indication value as a determined impedance indication value;
   determining, for a plurality of gain setting combinations, an EIS excitation current value at which current measurement circuitry of the current measurement system will reach a specified amount of a non-saturation range of the current measurement system when measuring the determined impedance indication value; and
   determining, for the plurality of gain setting combinations, a signal-to-noise characteristic at the determined EIS excitation current based upon a determined noise level in at least one part of the EIS current measurement system.

2. The method of claim 1, comprising selecting, from the plurality of gain setting combinations, a combination that results in a largest estimated signal-to-noise ratio.

3. The method of claim 2, comprising performing an EIS measurement with one or more gain values corresponding to the selected combination programmed into the EIS current measurement system.

4. The method of claim 2, comprising selecting the determined EIS excitation current corresponding to the selected combination.

5. The method of claim 1, wherein the electrochemical cell arrangement impedance indication value is estimated based on a membrane area of an electrolytic cell.

6. The method of claim 1, wherein the specified amount of non-saturation range is 80 percent.

7. The method of claim 1, wherein the plurality of gain setting combinations include a range of gain values for a pre-gain amplifier of the current measurement circuitry.

8. The method of claim 1, comprising determining the EIS excitation current value based on an input voltage value and at least one gain stage, wherein gain values for the at least one gain stage are included in the plurality of gain setting combinations.

9. The method of claim 1, wherein the determined noise level in at least one part of the EIS current measurement system includes a determined noise level in an electrolytic power supply.

10. The method of claim 9, wherein the determined noise level in at least one part of the EIS current measurement system includes a determined noise level in an EIS current power supply and a noise level in the current measurement circuitry.

11. The method of claim 1, comprising generating a look-up-table including the gain setting combination that results in a largest signal-to-noise ratio for each of a plurality of electrochemical cell arrangement impedance indication values.

12. The method of claim 11, comprising:
   selecting, from the look-up-table, the combination corresponding to a cell arrangement impedance value; and
   selecting the gain settings corresponding to the selected combination.

13. The method of claim 1, wherein the determining an EIS excitation current value at which current measurement circuitry of the EIS current measurement system will reach the specified amount of non-saturation range includes using a DC current in the EIS current measurement system.

14. The method of claim 1, wherein the determining the larger one of the electrochemical cell arrangement impedance indication value and the sense resistor arrangement impedance indication value includes measuring the impedance of at least one of the cell arrangement or the sense resistor arrangement using the EIS current measurement system.

15. The method of claim 1, comprising:
selecting a gain combination;
conducting an EIS current measurement sweep over at least two frequencies;
in response to the current measurement circuitry saturating, selecting a gain setting combination with a reduced overall gain for the frequency at which the current measurement circuitry saturated; and
re-conducting the EIS current measurement for the frequency at which the current measurement circuitry saturated.

16. The method of claim 15, comprising:
in response to the current measurement circuitry saturating, selecting a gain setting combination with a reduced overall gain for the at least two frequencies; and
re-conducting the EIS current measurement sweep over the at least two frequencies.

17. The method of claim 1, comprising:
selecting a gain combination;
conducting an EIS current measurement sweep over at least two frequencies;
in response to the current measurement circuitry not saturating, selecting a gain setting combination with an increased overall gain for the frequency at which the current measurement circuitry saturated; and
re-conducting the EIS current measurement for the frequency at which the current measurement circuitry saturated.

18. A method for selecting one or more gain values in an electrochemical impedance spectroscopy (EIS) current measurement system to provide an improved signal-to-noise characteristic, the method comprising:
selecting an excitation current gain such that an excitation current is a specified percentage of a power supply current;
selecting a larger one of an electrochemical cell arrangement impedance indication value and a sense resistor arrangement impedance indication value and using the selected impedance indication value as a determined impedance indication value; and
selecting a voltage measurement circuitry current gain such that the current measurement system will reach a specified amount of a non-saturation range of the current measurement system when measuring the determined impedance indication value.

19. The method of claim 18, comprising performing an EIS measurement with one or more gain values corresponding to the selected excitation current gain and the selected voltage measurement circuitry current gain programmed into the EIS current measurement system.

20. The method of claim 18, comprising:
selecting a gain combination;
conducting an EIS current measurement sweep over at least two frequencies;
in response to the current measurement system saturating, selecting a gain setting combination with a reduced overall gain for the frequency at which the current measurement circuitry saturated; and
re-conducting the EIS current measurement for the frequency at which the current measurement circuitry saturated.

* * * * *